US010541042B2

(12) United States Patent
Nelson et al.

(10) Patent No.: US 10,541,042 B2
(45) Date of Patent: Jan. 21, 2020

(54) LEVEL-CROSSING MEMORY TRACE INSPECTION QUERIES

(71) Applicant: Microsoft Technology Licensing, LLC, Redmond, WA (US)

(72) Inventors: Patrick Nelson, Redmond, WA (US); Jackson Davis, Carnation, WA (US); Del Myers, Seattle, WA (US); Thomas Lai, Redmond, WA (US); Deborah Chen, Seattle, WA (US); Jordi Mola, Bellevue, WA (US); Juan Carlos Arevalo Baeza, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/960,177

(22) Filed: Apr. 23, 2018

(65) Prior Publication Data
US 2019/0325980 A1    Oct. 24, 2019

(51) Int. Cl.
*G11C 29/38*    (2006.01)
*G11C 29/44*    (2006.01)

(52) U.S. Cl.
CPC .............. *G11C 29/38* (2013.01); *G11C 29/44* (2013.01)

(58) Field of Classification Search
CPC ..... G11C 29/38; G11C 29/44; G06F 11/3636; G06F 11/0766; G06F 11/3476; G06F 11/3612
See application file for complete search history.

(56) References Cited

U.S. PATENT DOCUMENTS

| 5,375,125 A | 12/1994 | Oshima et al. |
| 6,148,381 A | 11/2000 | Jotwani |
| 6,523,169 B1 | 2/2003 | Glunz |
| 8,271,955 B1 | 9/2012 | Lindahl et al. |
| 8,935,673 B1 | 1/2015 | Ashkenazi et al. |

(Continued)

FOREIGN PATENT DOCUMENTS

WO    2018071450 A1    4/2018

OTHER PUBLICATIONS

"What is the purpose of a Data Access Layer?", retrieved from <<https://stackoverflow.com/questions/59942/what-is-the-purpose-of-a-data-access-layer>>, Nov. 21, 2010, 4 pages.

(Continued)

*Primary Examiner* — Phung M Chung
(74) *Attorney, Agent, or Firm* — Workman Nydegger

(57) ABSTRACT

Described technologies extend the information available from an execution trace of a program by providing heuristically-derived values for memory contents when the trace does not include data expressly showing the value of a memory cell at a particular execution time. Various heuristics are described. The heuristics may use information about the memory cell at other times to produce the derived value. Some heuristics use other trace data, such as whether the memory cell is in a stack, whether there are gaps in the trace, or whether garbage collection or compilation occurred near the time in question. Grounds for the derived value are reported along with the derived value. A time-travel debugger or other program analysis tool can then present the derived values to users, or make other use of the derived values and grounds to assist debugging and other efforts to improve the functioning of a computing system.

20 Claims, 15 Drawing Sheets

(56) References Cited

U.S. PATENT DOCUMENTS

| | | | |
|---|---|---|---|
| 8,996,812 | B2 | 3/2015 | Kornegay et al. |
| 9,286,186 | B2 * | 3/2016 | Weiss .................. G06F 11/3668 |
| 9,355,012 | B2 | 5/2016 | Rosen |
| 9,465,721 | B2 | 10/2016 | Garrett et al. |
| 9,778,969 | B2 * | 10/2017 | Liu ....................... G06F 11/073 |
| 9,875,173 | B2 | 1/2018 | Marron et al. |
| 9,898,385 | B1 | 2/2018 | O'Dowd et al. |
| 9,916,232 | B2 | 3/2018 | Voccio et al. |
| 9,940,369 | B1 | 4/2018 | Mola |
| 2006/0046854 | A1 | 3/2006 | Arevalo Baeza et al. |
| 2006/0248512 | A1 | 11/2006 | Messmer et al. |
| 2006/0277527 | A1 | 12/2006 | Davis et al. |
| 2008/0022265 | A1 | 1/2008 | Morris |
| 2008/0127054 | A1 | 5/2008 | Stubbs et al. |
| 2008/0127055 | A1 | 5/2008 | Davis et al. |
| 2009/0089764 | A1 | 4/2009 | Lai et al. |
| 2009/0113251 | A1 | 4/2009 | Goossen et al. |
| 2010/0325367 | A1 | 12/2010 | Kornegay et al. |
| 2011/0145662 | A1 | 6/2011 | Yuan et al. |
| 2012/0304156 | A1 | 11/2012 | Feiveson et al. |
| 2012/0331351 | A1 | 12/2012 | Davis et al. |
| 2013/0219366 | A1 | 8/2013 | Rosen |
| 2013/0219369 | A1 | 8/2013 | Rector et al. |
| 2014/0040897 | A1 | 2/2014 | Davis et al. |
| 2014/0380102 | A1 | 12/2014 | Lindo et al. |
| 2015/0127991 | A1 | 5/2015 | Davis et al. |
| 2015/0135194 | A1 | 5/2015 | Alvarez Cavazos et al. |
| 2015/0143344 | A1 | 5/2015 | Davis |
| 2015/0161397 | A1 | 6/2015 | Cook et al. |
| 2015/0199259 | A1 | 7/2015 | Paveza et al. |
| 2015/0199261 | A1 | 7/2015 | Paveza et al. |
| 2015/0347269 | A1 | 12/2015 | Nelson et al. |
| 2015/0347274 | A1 | 12/2015 | Taylor et al. |
| 2016/0124834 | A1 | 5/2016 | Davis et al. |
| 2016/0239357 | A1 | 8/2016 | Davis et al. |
| 2017/0300400 | A1 | 10/2017 | Davis |
| 2018/0024911 | A1 | 1/2018 | Kruszewski et al. |
| 2018/0060213 | A1 | 3/2018 | Mola |
| 2018/0060215 | A1 | 3/2018 | Mola |
| 2018/0253369 | A1 | 9/2018 | O'Dowd et al. |
| 2019/0065339 | A1 | 2/2019 | Mola |
| 2019/0087305 | A1 | 3/2019 | Mola |
| 2019/0324892 | A1 | 10/2019 | Gabryjelski et al. |

OTHER PUBLICATIONS

"Data access layer", retrieved from <<https://en.wikipedia.org/wiki/Data_access_layer>>, Aug. 21, 2017, 2 pages.

"Elm Debugger", retrieved from <<http://debug.elm-lang.org/>>, copyright 2014, 4 pages.

"Microsoft/PTVS", retrieved from <<https://github.com/Microsoft/PTVS>>, no later than Mar. 1, 2018, 2 pages.

"How does reverse debugging work?", retrieved from <<https://stackoverflow.com/questions/1470434/how-does-reverse-debugging-work>>, Sep. 24, 2009, 5 pages.

Bhansali, et al., "Framework for Instruction-level Tracing and Analysis of Program Executions", retrieved from <<http://static.usenix.org/events/vee06/full_papers/p154-bhansali.pdf>>, 2006, 10 pages.

Mußler, et al., "A Generic Binary Instrumenter and Heuristics to Select Relevant Instrumentation Points", retrieved from <<http://juser.fz-juelich.de/record/12504/files/J%C2%A9%C6%A1I_4335_Mu%C2%A9ler.pdf>>, Nov. 2010, 110 pages.

"Time Travel Debugging—Record a trace", retrieved from <<https://docs.microsoft.com/en-us/windows-hardware/drivers/debugger/time-travel-debugging-record>>, Sep. 22, 2017, 5 pages.

"Microsoft/PTVS", retrieved from <<https://github.com/Microsoft/PTVS/tree/master/Python/Product/Debugger.Concord>>, no later than Mar. 1, 2018, 1 page.

Cabral, et al., "RAIL: code instrumentation for .NET", retrieved from <<https://www.researchgate.net/publication/221001208_RAIL_code_instrumentation_for_NET>>, Jan. 2005, 7 pages.

"RevDeBug", retrieved from <<https://www.revdebug.com/>>, no later than Mar. 1, 2018, 7 pages.

"RevDeBug Tutorial", retrieved from <<https://revdebug.com/doc/tutorial/2.5.0.0/Selectiverecording-Whitelisting>>, no later than Mar. 1, 2018, 6 pages.

"Reverse/'Time Traveling' Debuggers for Javascript", retrieved from <<https://stackoverflow.com/questions/21841808/reverse-time-traveling-debuggers-for-javascript>>, Feb. 18, 2014, 1 page.

"Rider", retrieved from <<https://www.jetbrains.com/rider/>>, no later than Mar. 1, 2018, 4 pages.

Tamches, et al., "Fine-Grained Dynamic Instrumentation of Commodity Operating System Kernels", retrieved from <<http://pages.cs.wisc.edu/~paradyn/ParadynWeek/1999-notes/tamches.pdf>>, 1999, 24 pages.

"Reverse debugging, time travel debugging", retrieved from <<https://undo.io/resources/whitepapers/reverse-debugging-whitepaper/>>, no later than Mar. 1, 2018, 10 pages.

JamesP, "Time Travel Debugging in WinDbg Preview!", retrieved from <<https://blogs.msdn.microsoft.com/windbg/2017/09/25/time-travel-debugging-in-windbg-preview/>>, Sep. 25, 2017, 35 pages.

"Tracing_(software)", retrieved from <<https://en.wikipedia.org/wiki/Tracing_(software)>>, Aug. 30, 2017, 4 pages.

"UndoDB", retrieved from <<https://undo.io/products/undodb/>>, no later than Mar. 1, 2018, 7 pages.

"What is the principle of 'Time Travel Debugger'?", retrieved from <<https://stackoverflow.com/questions/42104003/what-is-the-principle-of-time-travel-debugger>>, Oct. 8, 2017, 3 pages.

BValzer, "EXDAMS—Extendable Debugging and Monitoring System", retrieved from <<http://www.dtic.mil/dtic/tr/fulltext/u2/686373.pdf>>, 1969, 40 pages.

Coetzee, "Combining reverse debugging and live programming towards visual thinking in computer programming", retrieved via <<http://scholar.sun.ac.za/handle/10019.1/96853>>, Mar. 2015, 105 pages.

"Non-Final Office Action Issued in U.S. Appl. No. 15/960,066", dated Apr. 24, 2019, 17 Pages.

"International Search Report and Written Opinion Issued in PCT Application No. PCT/US2019/027573", dated Jul. 15, 2019, 18 Pages.

"International Search Report and Written Opinion Issued in PCT Application No. PCT/US2019/026209", dated Jul. 23, 2019, 15 Pages.

Montesinos, et al., "Capo: A Software-hardware Interface for Practical Deterministic Multiprocessor Replay", in Proceedings of International Conference Architectural Support for Programming Languages and Operating Systems, Mar. 7, 2009, 12 Pages.

* cited by examiner

LEVEL-CROSSING MEMORY TRACE INSPECTION QUERIES

CROSS-REFERENCE TO RELATED APPLICATIONS

This application is related to U.S. patent application Ser. No. 15/959,881, titled "VISUALIZING LAST/NEXT KNOWN DATA VALUES IN TIME TRAVEL TRACES", and U.S. patent application Ser. No. 15/960,066, titled "MEMORY VALIDITY STATES IN TIME-TRAVEL DEBUGGING", both filed Apr. 23, 2018. The entire contents of each of these applications are incorporated by reference herein in their entireties.

BACKGROUND

Computer software is often complex. Part of the complexity may arise from the nature of the work a program is designed to perform, e.g., tracking large numbers of real-world items or ongoing transactions over hours or longer periods of time, coordinating activities with other complex software, controlling complex hardware, and so on. In almost any real-world use of software, complexity also arises because many details are introduced and should be correctly managed in order to instruct computer hardware how to perform real-world work that is initially described much less precisely in English or another natural language. That is, the transformation from a high-level description to a low-level implementation which is executable by a computer system, inevitably introduces complexity. Even programming language source code, which is more precise than natural languages, is still at a relatively high level and therefore is ambiguous, being open to various understandings and implementations. Source code is transformed into low-level instructions that can be directly executed by computational hardware, with many details being introduced and choices being made during that transformation.

Complexity introduces the all-too-often realized possibility of programming errors, a.k.a. "bugs". The process of identifying the cause of a bug and attempting to modify a program to remediate or remove the bug's impact is referred to as "debugging". Specialized software tools which assist debugging are called "debuggers". The program being debugged is called the "debuggee".

Debugging is perhaps easiest when a developer can run the debuggee slowly, or at full speed, or pause execution of the debuggee, all at will, and can examine all state information of the debuggee at any point in the debuggee's execution. This is known as "live process debugging". However, such full access to a debuggee is often not available. For example, the debuggee may be production software that cannot be debugged live without violating service agreements or harming the reputation, security, or finances of an interested party. Unacceptable harms may occur if the live process debuggee is paused for seconds at a time while the developer examines variable values, checks to see which functions were called with which parameter values, reviews the source code, considers possible explanations for the bug, and devises tests that might help identify, remediate, or eliminate the bug.

Accordingly, sometimes state information is recorded as the debuggee executes, to be examined later without substantially pausing the debuggee's execution. Creating such a recording may slow down the debuggee, but the recording may provide helpful information without hurting production performance targets the way live debugging could. For instance, the debuggee may be paused just long enough to create a memory dump which copies to disk some or all of the memory values pertinent to the debugger at a particular point in time. Some aspects of the debuggee's execution may also be recorded in an execution trace. Some debuggers support use of such a trace to replay the execution of the traced debuggee, without the debuggee being a live process. With some debuggers, the debuggee execution can be replayed in forward or in reverse, thus permitting "time travel", "reverse", or "historic" debugging.

However, because the execution trace contains less information than is sometimes available during live process debugging, and because the execution trace records state information at a low level, technical challenges arise when a debugger seeks information about memory contents for times during the execution at which the trace does not have an express read or write showing the value of the memory in question at the time in question.

Accordingly, advances in efficiently and accurately estimating or otherwise deriving memory values from a low-level execution trace helps improve the information that is available to debuggers, and thus will tend to improve the function of debuggee computer systems by facilitating the mediation and eradication of their bugs.

SUMMARY

Some technologies described herein are directed to the technical activity of extrapolating a memory cell's value from execution trace data that does not expressly state the value of the memory cell at a particular execution time of interest, thereby improving trace-based debugging. Some teachings are directed to specific heuristic procedures which implement computations that choose between possible values of a memory cell when multiple candidate values are present. Technical mechanisms are described for adapting a debugging environment to obtain state information from a trace instead of from a runtime of a live process. Specific technical tools and techniques are described here in response to the challenge of replaying debuggee execution, in forward or reverse or both, based on an execution trace. Other technical activities pertinent to teachings herein will also become apparent to those of skill in the art.

Some embodiments described herein use or provide memory inspection functionalities, such as providing derived data values from an execution trace, in response to queries from a high-level debugger having a data access component (DAC). One embodiment includes a processor, a digital memory in operable communication with the processor, and a DAC adapter. The DAC adapter includes a heuristic computation code and an interface. Upon execution by the processor, the DAC adapter (a) receives in the interface a query which specifies a memory cell and an execution time t, (b) determines automatically that the execution trace fails to expressly specify a known value for the memory cell at the execution time t, (c) executes the heuristic computation code, which produces a derived value for the memory cell at the execution time t based on information in the execution trace, and (d) provides in the interface a response to the query, the response including the derived value together with an indication that the value provided in the response for the memory cell at the execution time t is derived via at least one heuristic.

Some embodiments described herein use or provide computer-implemented memory inspection to get heuristically-derived data values of one or more memory cells at an execution time t from an execution trace when the trace does not have data showing the values at the time t. This can be accomplished, for example, by: receiving a query which specifies a plurality of memory cells and an execution time t; executing a heuristic computation which searches at least a portion of the execution trace for state information of the memory cells; obtaining as results of the heuristic computation a respective heuristically-derived value of each memory cell and a respective ground of that derived value, the obtained grounds including at least two of the following grounds: known-past-value, known-current-value, known-future-value; and reporting the derived values of the memory cells, together with at least one of the grounds, in a response to the query. The reporting includes providing information about the value of the memory cells which is not limited to any values that were recorded into the execution trace at execution time t.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope. Although dashed lines indicate that some items are optional, any item which is recited in a claim or is considered by one of skill in the art as non-optional for embodying a claim is understood to be present in some form in an embodiment of the claim.

DETAILED DESCRIPTION

Overview

Figure 1:
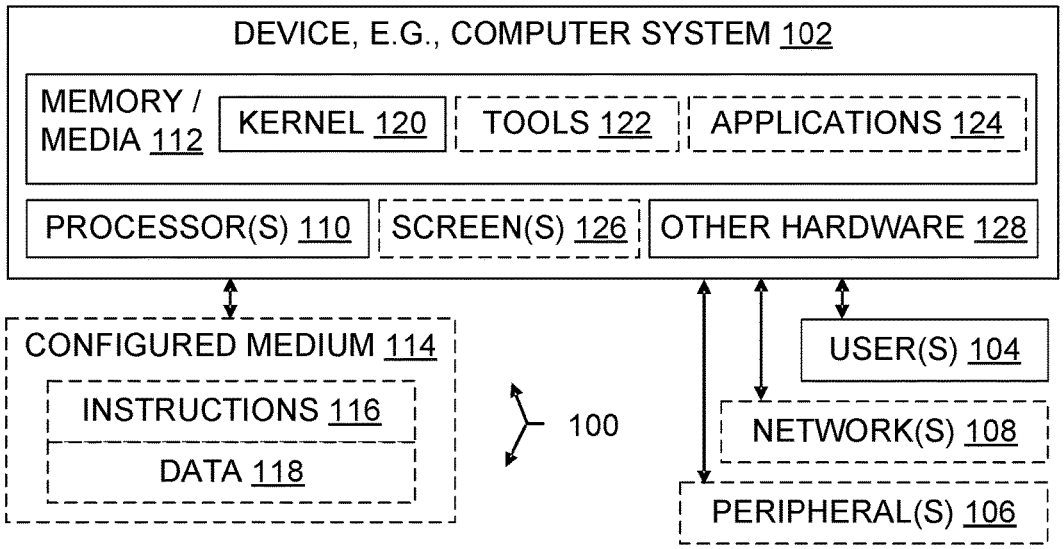
FIG. 1 is a block diagram illustrating a computer system and also illustrating a configured storage medium.

Debugging in a production cloud environment poses serious technical challenges. For example, suppose a particular request R to an online shopping cart is not working. How can a developer debug the processing of request R without slowing down the processing of all the other requests and with a minimal slowdown in the processing of request R? To find the bug, the developer uses information about what is happening inside the code, e.g., a way to see the values of variables at one or more points of interest during the processing of request R.

Trace-based debugging innovations discussed here help overcome technical challenges left unresolved by conventional approaches. For instance, many conventional debuggers and debugging methods allow a developer to set halt breakpoints to get information about variable values. Halt breakpoints are instructions that halt execution so the developer has time to examine memory contents at a given point in the processing and consider possible explanations for what is observed. But in a production environment, a halt breakpoint could halt the processing of numerous requests, and that is undesirable.

Some familiar debugging approaches involve adding print statements to print the value of particular variables at particular points in the code, or adding other code, e.g., to test the value of a variable to see whether it is what the developer expects it to be at that point in the code. But these approaches may require recompiling and redeploying code, which is not favored in a production environment, particularly if recompiling and redeploying are to be done multiple times as part of an iterative debugging process to find and fix a single bug. Also, the developer may be asked to identify bugs in code that the developer does not have source for and thus cannot add print statements to and recompile.

The developer could inject an operation into the request processing code at runtime to make a copy of part or all of the memory pertaining to the request. The copy may include a "snapshot" 304 (an in-memory copy of a process that shares memory allocation pages with the original process via copy-on-write) or a "dump" file 302 (a serialized copy of the process), or both. Some conventional debuggers can read a dump file or a snapshot and, given appropriate metadata, can present memory content in a format that shows variable values translated from binary into informative structures that include variable names and that display variable values based on the respective data types of the variables. But dumping memory to a file takes significant time, which slows down the processing of all requests in the example scenario, not merely request R. Even though making a snapshot is much faster than creating a dump file, it may take a developer many attempts to find a useful point in the processing to take the memory snapshot that is reveals the bug, and snapshots consume space in RAM. To get a view of the memory at another point in time than the execution time captured in a dump file or a snapshot, another memory copy could be created.

To get a view of the memory at any point in time from a live process, the live process is used. In many modern computing systems, as illustrated in the FIG. 2 example, the live process 202 includes a runtime 204 in addition to relying on an operating system 120. Unlike processes that lack runtimes, which can be controlled directly by a debugger through insertion of halt breakpoints, processes that depend on a runtime cannot be directly controlled by a debugger 200 because their runtime effectively hides from the debugger details 206 such as memory locations, memory contents, and instruction pointers. To show the developer what is in the memory during debugging, the debugger sends the runtime a message 214 asking for current memory values, the runtime sends the values to the debugger in a reply message 216, and the debugger displays in some user interface 210 the values it received in the reply message.

The runtime also controls execution of a live debuggee. In one example, to set a breakpoint at an intermediate language (IL) instruction in method Foo, at offset 28, a message is sent to the runtime asking it to set a breakpoint at Foo, offset 28. Then a thread within the runtime will receive that message, translate Foo IL offset 28 into a machine instruction residing at memory address 0x4567123512395, and then write a breakpoint instruction at that location.

The user interface 210 displays the debugger's representations of the program state to the user graphically. Some examples of program state are a list of threads, the next line of source code to execute on each thread, a call stack for each thread, a set of variables in each frame of the call stack, the values of those variables, and so on.

In some implementations, a runtime translating portion of the debugger 200 is responsible for translating between low-level concepts such as memory cells and registers, on the one hand, and the runtime abstractions, on the other. Examples of runtime abstractions include a list of threads, one or more callstacks for each thread, and the IL instruction that will be executed next. Note that a callstack at the runtime layer of abstraction is not necessarily the same as a callstack at the source code level of abstraction.

It is possible to create an execution trace 418 of a process. The trace can then be replayed using emulation of the hardware 102. Sometimes this traced process is written in a high-level language 212 which requires the process 202 to be executed by a runtime framework 204. The trace itself may be difficult to debug because the trace data reflects a view at a low level (e.g., the runtime or just-in-time compiled code or both), rather than the high-level language the program was written in. Some tracing technologies don't provide the high-level view of a process that a developer 104 may well prefer. Most high-level runtimes require that the runtime itself provide information about programs running within its framework. Thus, conventional debugging may require the process to be executing within the runtime, which is not an option when debugging is based on a trace instead of a live process.

Like any other process, a runtime can be traced. However, debugging software other than a runtime is more common than debugging a runtime, and unless indicated otherwise it is assumed herein that a traced process may exclude some or all code that is part of the runtime itself. Trace files 420 which trace only the execution of a process that relied on a runtime and do not trace the runtime itself, do not fully support reading the values of runtime-managed objects from a trace file with a conventional debugging approach. There is no executing runtime for the debugger to fully correlate memory locations with objects and other variables, and thus give meaning to the memory values that are exposed by the trace. To control the execution of a live process that is executing code reliant on a runtime, the debugger may send the runtime a message requesting an operation such as "step" or "run", and then the runtime executes the operation on behalf of the debugger. This functionality does not work with a trace file that has no currently executing runtime.

Dump files 302 and snapshots 304 are similar to traces in terms of the runtime being unavailable to use. The runtime may be represented in the dump or snapshot or trace, but it is not executing and thus cannot be called into.

Nonetheless, trace files 420 can be made part of a debugging environment. Some trace-based debugging inventions discussed here extend the power of debugging so that debuggers can read memory 112 from a trace file at multiple points in execution time chosen by a developer. One approach inserts a data access layer between the trace and the high-level language debugger. The data access layer understands the runtime's data structures. This allows inspection of the high-level process.

In some situations, a developer can use a "time travel" debugger to control execution replay to run forward in execution time or backward in execution time when replaying a recorded trace 418, thereby leveraging the ability of a debugger to present memory in useful high-level (e.g., named and data type-based) variable presentations, not only for snapshots as before but also now for a continuous replay of a segment of execution time recorded during code execution. Memory values captured in the trace can then be inspected by the developer in a high-level presentation at multiple points, based on the low-level data recorded in the trace file. Of course, memory inspection requires reading memory cell values from the trace, or else reading other values and somehow gaining from them useful information about the memory values that are sought during the replay. Heuristics described herein help debuggers and other tools obtain useful information about memory values even when the trace does not expressly state the value at a desired point in execution time.

Using a data access layer when debugging with a process dump or snapshot as a data source, one can view information about the high-level program state within the runtime. The data access layer can be adapted by use of an adapter 408 and then utilized to provide and update a dynamically changing debuggee state as the trace is replayed. Thus adapted, the debugger 200 can apply a runtime (high-level) view of a process trace that has been recorded as machine-level operations. For purposes of the present application only, "machine-level" operations are those specified at the level of assembly language or intermediate language or lower. Some suitable data access adapters are described herein, to support inspection of a runtime using a machine-level trace.

Some embodiments described herein may be viewed by some people in a broader context. For instance, concepts such as deriving values, inspecting memory, and recording activities may be deemed relevant to a particular embodiment. However, it does not follow from the availability of a broad context that exclusive rights are being sought herein for abstract ideas; they are not. Rather, the present disclosure is focused on providing appropriately specific embodiments whose technical effects fully or partially solve particular technical problems, such as how to estimate a value stored in a memory cell at specified execution times, using trace data that does not expressly state the value of the memory cell in question at the execution time in question. Other media, systems, and methods involving deriving values, inspecting memory, or recording activities are outside the present scope. Accordingly, vagueness, mere abstractness, lack of technical character, and accompanying proof problems are also avoided under a proper understanding of the present disclosure.

Technical Character

The technical character of embodiments described herein will be apparent to one of ordinary skill in the art, and will also be apparent in several ways to a wide range of attentive readers. Some embodiments address technical activities that are rooted in computing technology and improve the functioning of computing systems by helping debug those systems. For instance, some embodiments help narrow the range of possible values held by a variable at a specified point in execution time, based on trace data, even when the trace does not include an access to the variable at that point in time. Some activities of embodiments support an estimation or other heuristic derivation of memory cell contents using specific heuristic computations, and also provide developers with grounds indicating that the contents were derived and identifying the kind of derivation that was performed to produce the derived value.

Some embodiments include technical components such as computing hardware which interacts with software in a manner beyond the typical interactions within a general purpose computer. For example, in addition to normal interaction such as memory allocation in general, memory reads and writes in general, instruction execution in general, and some sort of I/O, some embodiments described herein implement heuristic algorithm steps disclosed herein.

Technical effects provided by some embodiments include more efficient use of debugging time, reduced re-tracing to obtain additional trace data, reduced trace file size since more debugging can be done with less trace data, and improved debugger functionality for the exploration of causality and alternative debuggee implementations during replay because those explorations often involve looking at values that were not seen at that execution time by the traced processor.

Some embodiments include technical adaptations such as a DAC adapter which accepts queries formatted for a runtime and responds to those queries in a format that could be used by a runtime during live debugging, and a map between an execution time t and derived memory cell values at time t.

Other advantages based on the technical characteristics of the teachings will also be apparent to one of skill from the description provided.

Acronyms and Abbreviations

Some acronyms and abbreviations are defined below. Others may be defined elsewhere herein or require no definition to be understood by one of skill.

ALU: arithmetic and logic unit
API: application program interface
BIOS: basic input/output system
CD: compact disc
CPU: central processing unit
DAC: data access component
DVD: digital versatile disk or digital video disc
FPGA: field-programmable gate array
FPU: floating point processing unit
GPU: graphical processing unit
GUI: graphical user interface
IDE: integrated development environment, sometimes also called "interactive development environment"
OS: operating system
RAM: random access memory
ROM: read only memory Additional Terminology Reference is made herein to exemplary embodiments such as those illustrated in the drawings, and specific language is used herein to describe the same. But alterations and further modifications of the features illustrated herein, and additional technical applications of the abstract principles illustrated by particular embodiments herein, which would occur to one skilled in the relevant art(s) and having possession of this disclosure, should be considered within the scope of the claims.

The meaning of terms is clarified in this disclosure, so the claims should be read with careful attention to these clarifications. Specific examples are given, but those of skill in the relevant art(s) will understand that other examples may also fall within the meaning of the terms used, and within the scope of one or more claims. Terms do not necessarily have the same meaning here that they have in general usage (particularly in non-technical usage), or in the usage of a particular industry, or in a particular dictionary or set of dictionaries. Reference numerals may be used with various phrasings, to help show the breadth of a term. Omission of a reference numeral from a given piece of text does not necessarily mean that the content of a Figure is not being discussed by the text. The inventors assert and exercise their right to their own lexicography. Quoted terms are being defined explicitly, but a term may also be defined implicitly without using quotation marks. Terms may be defined, either explicitly or implicitly, here in the Detailed Description and/or elsewhere in the application file.

As used herein, a "computer system" may include, for example, one or more servers, motherboards, processing nodes, laptops, tablets, personal computers (portable or not), personal digital assistants, smartphones, smartwatches, smartbands, cell or mobile phones, other mobile devices having at least a processor and a memory, video game systems, augmented reality systems, holographic projection systems, televisions, wearable computing systems, Internet of Things nodes, and/or other device(s) providing one or more processors controlled at least in part by instructions. The instructions may be in the form of firmware or other software in memory and/or specialized circuitry.

A "multithreaded" computer system is a computer system which supports multiple execution threads. The term "thread" should be understood to include any code capable of or subject to scheduling (and possibly to synchronization), and may also be known by another name, such as "process," or "coroutine," for example. The threads may run in parallel, in sequence, or in a combination of parallel execution (e.g., multiprocessing) and sequential execution (e.g., time-sliced).

A "processor" is a thread-processing unit, such as a core in a simultaneous multithreading implementation. A processor includes hardware. A given chip may hold one or more processors. Processors may be general purpose, or they may be tailored for specific uses such as vector processing, graphics processing, signal processing, floating-point arithmetic processing, encryption, I/O processing, and so on.

"Kernels" include operating systems, hypervisors, virtual machines, BIOS code, and similar hardware interface software.

"Code" means processor instructions, data (which includes constants, variables, and data structures), or both instructions and data. "Code" and "software" are used interchangeably herein. Executable code, interpreted code, and firmware are some examples of code. Code which is interpreted or compiled in order to execute is referred to as "source code".

"Program" is used broadly herein, to include applications, kernels, drivers, interrupt handlers, firmware, state machines, libraries, and other code written by programmers (who are also referred to as developers) and/or automatically generated.

"Service" means a consumable program offering in a cloud computing environment or other network environment.

"Execution time point" means a specific point of execution for a processing unit or thread, especially as relates to traced execution. References herein to a "particular execution time" or an "execution time t" or the like are references to an execution time point. An execution time point may be implemented as a timecode variable or timecode value, or as a relative position in a trace or other record of execution activity, for example. An execution time point to being "prior to" or "later than" an execution time point tb implies that a relative ordering of the two execution time points is determined. Similarly, a "younger" execution time point is one that is later than an "older" execution time point.

Information in a trace about the ordering of traced events may be incomplete. Thus, a trace may have sufficient information to establish that an event A is prior to an event B, or to establish that an event D is later than an event C. But the relative order of events may also be partially or fully indeterminate, so far as the trace is concerned. The trace may show that event E is not after event F, but that does not necessarily imply E is before F; similarly, a trace may show that an event K is not before an event J without the trace also showing that K is after J. The trace may also lack sufficient information to establish any ordering of two particular events relative to one another.

"Timecode" means a monotonically changing value which can be used to impose an ordering on at least some events in an execution trace. It is expected that timecodes will often be monotonically increasing values, but timecodes could also be implemented as monotonically decreasing values. Some examples of timecodes include instruction counters, clock times (a.k.a. clock ticks), and entirely artificial (not based on a register or instruction) monotonic values. Depending on the trace, all or some or none of the traced events may have respective associated timecodes. When timecodes are present, they may be unique, or they may be merely monotonic because some timecode values are repeated.

"Memory cell" means an addressable unit of memory. Some examples include a byte or word in RAM or in ROM, a processor register, a cache line, and other addressable units of memory.

An "emulator" performs "emulation" which provides the same functionality as original hardware, but uses a different implementation or different hardware or both. One example is a CPU Emulator, which acts like a CPU and can be used to execute code like the original CPU hardware, but has a different implementation than the original CPU, e.g., the emulator may run on entirely different physical hardware.

As used herein, "include" allows additional elements (i.e., includes means comprises) unless otherwise stated.

"Optimize" means to improve, not necessarily to perfect. For example, it may be possible to make further improvements in a program or an algorithm which has been optimized.

"Process" is sometimes used herein as a term of the computing science arts, and in that technical sense encompasses computational resource users, namely, coroutines, threads, tasks, interrupt handlers, application processes, kernel processes, procedures, and object methods, for example. "Process" is also used herein as a patent law term of art, e.g., in describing a process claim as opposed to a system claim or an article of manufacture (configured storage medium) claim. Similarly, "method" is used herein at times as a technical term in the computing science arts (a kind of "routine") and also as a patent law term of art (a "process"). Those of skill will understand which meaning is intended in a particular instance, and will also understand that a given claimed process or method (in the patent law sense) may sometimes be implemented using one or more processes or methods (in the computing science sense).

"Automatically" means by use of automation (e.g., general purpose computing hardware configured by software for specific operations and technical effects discussed herein), as opposed to without automation. In particular, steps performed "automatically" are not performed by hand on paper or in a person's mind, although they may be initiated by a human person or guided interactively by a human person. Automatic steps are performed with a machine in order to obtain one or more technical effects that are not realized without the technical interactions thus provided.

One of skill understands that technical effects are the presumptive purpose of a technical embodiment. The mere fact that calculation is involved in an embodiment, for example, and that some calculations can also be performed without technical components (e.g., by paper and pencil, or even as mental steps) does not remove the presence of the technical effects or alter the concrete and technical nature of the embodiment. Operations such as searching trace data fast enough to permit replay within one or two orders of magnitude of the original execution speed, including heuristic computations, are understood herein as requiring and providing speed and accuracy that are not obtainable by human mental steps, in addition to their inherently digital nature (a human mind cannot interface directly with a trace file or other digital storage to retrieve the necessary trace data). This is well understood by persons of skill in the art, but others may sometimes benefit from being informed or reminded of the facts. Unless stated otherwise, embodiments are presumed to be capable of operating at scale in production environments, or in testing labs for production environments, as opposed to being mere thought experiments.

"Computationally" likewise means a computing device (processor plus memory, at least) is being used, and excludes obtaining a result by mere human thought or mere human action alone. For example, doing arithmetic with a paper and pencil is not doing arithmetic computationally as understood herein. Computational results are faster, broader, deeper, more accurate, more consistent, more comprehensive, and/or otherwise provide technical effects that are beyond the scope of human performance alone. "Computational steps" are steps performed computationally. Neither "automatically" nor "computationally" necessarily means "immediately". "Computationally" and "automatically" are used interchangeably herein.

"Proactively" means without a direct request from a user. Indeed, a user may not even realize that a proactive step by an embodiment was possible until a result of the step has been presented to the user. Except as otherwise stated, any computational and/or automatic step described herein may also be done proactively.

Throughout this document, use of the optional plural "(s)", "(es)", or "(ies)" means that one or more of the indicated feature is present. For example, "processor(s)" means "one or more processors" or equivalently "at least one processor".

For the purposes of United States law and practice, use of the word "step" herein, in the claims or elsewhere, is not intended to invoke means-plus-function, step-plus-function, or 35 United State Code Section 112 Sixth Paragraph/Section 112(f) claim interpretation. Any presumption to that effect is hereby explicitly rebutted.

For the purposes of United States law and practice, the claims are not intended to invoke means-plus-function interpretation unless they use the phrase "means for". Claim language intended to be interpreted as means-plus-function language, if any, will expressly recite that intention by using the phrase "means for". When means-plus-function interpretation applies, whether by use of "means for" and/or by a court's legal construction of claim language, the means recited in the specification for a given noun or a given verb should be understood to be linked to the claim language and linked together herein by virtue of any of the following: appearance within the same block in a block diagram of the figures, denotation by the same or a similar name, denotation by the same reference numeral. For example, if a claim limitation recited a "zac widget" and that claim limitation became subject to means-plus-function interpretation, then at a minimum all structures identified anywhere in the specification in any figure block, paragraph, or example mentioning "zac widget", or tied together by any reference numeral assigned to a zac widget, is to be deemed part of the structures identified in the application for zac widgets and help define the set of equivalents for zac widget structures.

Throughout this document, unless expressly stated otherwise any reference to a step in a process presumes that the step may be performed directly by a party of interest and/or performed indirectly by the party through intervening mechanisms and/or intervening entities, and still lie within the scope of the step. That is, direct performance of the step by the party of interest is not required unless direct performance is an expressly stated requirement. For example, a step involving action by a party of interest such as applying, blending, building, calculating, computing, confirming, determining, executing, identifying, obtaining, performing, producing, providing, querying, ranking, receiving, reporting, responding, selecting, sending (and applies, applied, blends, blended, etc.) with regard to a destination or other subject may involve intervening action such as forwarding, copying, uploading, downloading, encoding, decoding, compressing, decompressing, encrypting, decrypting, authenticating, invoking, and so on by some other party, yet still be understood as being performed directly by the party of interest.

Whenever reference is made to data or instructions, it is understood that these items configure a computer-readable memory and/or computer-readable storage medium, thereby transforming it to a particular article, as opposed to simply existing on paper, in a person's mind, being mere energy, or as a mere signal being propagated on a wire, for example. For the purposes of patent protection in the United States, a memory or other computer-readable storage medium is not a propagating signal or a carrier wave or mere energy outside the scope of patentable subject matter under United States Patent and Trademark Office (USPTO) interpretation of the In re Nuijten case. No claim covers a signal per se in the United States, and any claim interpretation that asserts otherwise is unreasonable on its face. Unless expressly stated otherwise in a claim granted outside the United States, a claim does not cover a signal per se.

Moreover, notwithstanding anything apparently to the contrary elsewhere herein, a clear distinction is to be understood between (a) computer readable storage media and computer readable memory, on the one hand, and (b) transmission media, also referred to as signal media or mere energy, on the other hand. A transmission medium is a propagating signal or a carrier wave computer readable medium or mere energy. By contrast, computer readable storage media and computer readable memory are not propagating signal or carrier wave computer readable media. Unless expressly stated otherwise in the claim, "computer readable medium" means a computer readable storage medium, not a propagating signal per se and not mere energy.

An "embodiment" herein is an example. The term "embodiment" is not interchangeable with "the invention". Embodiments may freely share or borrow aspects to create other embodiments (provided the result is operable), even if a resulting combination of aspects is not explicitly described per se herein. Requiring each and every permitted combination to be explicitly described is unnecessary for one of skill in the art, and contrary to policies which recognize that patent specifications are written for readers who are skilled in the art. Formal combinatorial calculations and informal common intuition regarding the number of possible combinations arising from even a small number of combinable features will also indicate that a large number of aspect combinations exist for the aspects described herein. Accordingly, requiring an explicit recitation of each and every combination is contrary to policies calling for patent specifications to be concise and for readers to be knowledgeable in the technical fields concerned.

LIST OF REFERENCE NUMERALS

Figure 4:
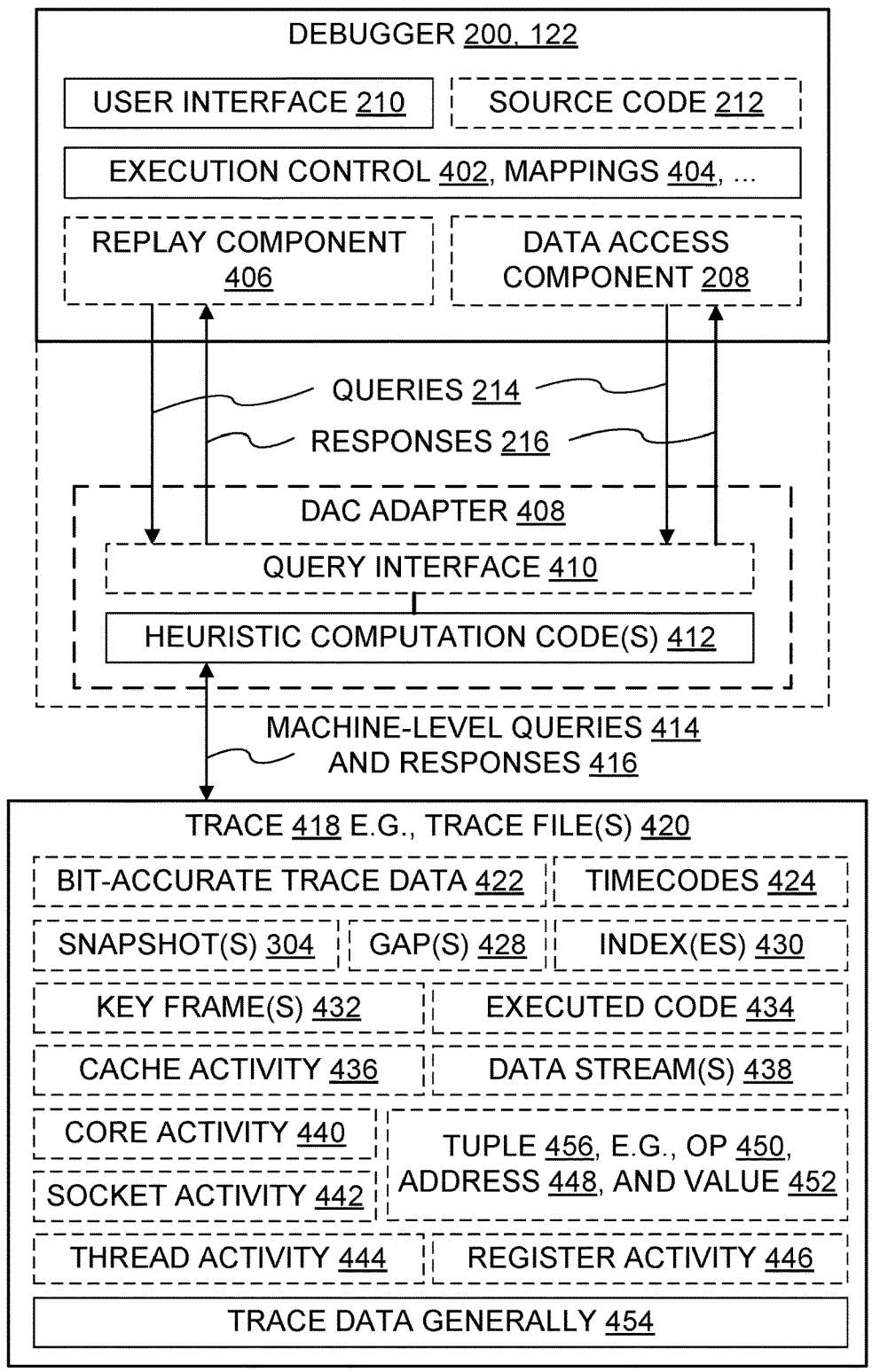
FIG. 4 is a block diagram illustrating aspects of trace-based debugging, including primary queries and responses between a debugger and a data access component adapter.

The following list is provided for convenience and in support of the drawing figures and as part of the text of the specification, which describe innovations by reference to multiple items. Items not listed here may nonetheless be part of a given embodiment. For better legibility of the text, a given reference number is recited near some, but not all, recitations of the referenced item in the text. The same reference number may be used with reference to different examples or different instances of a given item. The list of reference numerals is:

100 operating environment, also referred to as computing environment
102 computer system, also referred to as computational system or computing system
104 users
106 peripherals
108 network generally
110 processor 112 computer-readable storage medium, e.g., RAM, hard disks
114 removable configured computer-readable storage medium
116 instructions executable with processor; may be on removable media or in other memory (volatile or non-volatile or both)
118 data
120 kernel(s), e.g., operating system(s), BIOS, device drivers
122 tools, e.g., anti-virus software, profilers, debuggers, editors, compilers, interpreters, security penetration testers, fuzzers, etc.; may be adapted to use memory value derivation heuristics taught herein
124 applications, e.g., word processors, web browsers, spreadsheets
126 display screens
128 computing hardware not otherwise associated with a reference number 106, 108, 110, 112, 114
200 debugger
202 live debugee program or process
204 runtime
206 memory items, e.g., application or system data structures
208 data access component of debugger
210 user interface of debugger
212 source code, related information such as meta data and symbol table
214 primary query from debugger to debuggee information source, e.g., live debuggee or dump file reader software or snapshot reader software or trace file reader software
216 response to primary query that sought information from debuggee information source; also referred to as "primary response" as in a response at the abstraction level of a primary query, not as in first or initial or most important response
302 dump file, a.k.a. memory dump; may include additional information such as indexes or metadata
304 memory snapshot; may include additional information such as indexes or metadata
402 debuggee execution control code in debugger, e.g., to request or emulate execution control over debuggee such as stepping through debuggee, setting a breakpoint, executing the debuggee until a breakpoint is reached, etc.
404 mappings in debugger, e.g., mappings between source code and a lower level code such as assembly code, intermediate language code, etc.
406 replay component which emulates debuggee execution using a trace file
408 adapter for data access component (DAC) which allows the DAC to send queries and receive responses that are also used during the debugging of a live process; in a trace file debugging scenario the DAC adapter receives and responds to primary queries from a debugger that may be received and responded to by a runtime in a live process debugging scenario, and the DAC adapter also makes secondary queries to the trace file
410 DAC adapter query interface; configured for communications with debugger
412 heuristic computations code which communicates with trace file; heuristic computations code may read a trace file directly or may communicate with reader software that provides access to the trace
414 secondary query from DAC adapter to trace, where "secondary" indicates a lower level of abstraction than the primary query 214 level of abstraction; this secondary query may be a machine-level query that may be implemented as a communication to a trace file reader or may be implemented internally (e.g., as a function call) within the DAC adapter
416 response to machine-level query that sought information from trace; also referred to as "secondary response" as in a response at the abstraction level of a secondary query, not as in second response; may be implemented as a communication from a trace file reader or may be implemented internally (e.g., as function results or data structure updates) within the DAC adapter
418 execution trace; although dashed lines in FIG. 4 show that individual items may be included in or omitted from a given trace, it is assumed herein that the trace is not empty and therefore the box for trace data generally 454 shows a solid line
420 trace file containing execution trace data; may include machine-level trace data, namely, data which records execution activity at the level of assembly language or intermediate language or lower
422 bit-accurate trace data in a trace
424 timecodes in a trace identifying particular execution time points in the execution of traced code; may be linked to or embedded within other data inside a trace, e.g., in trace data that expressly states an execution time point associated with a stated operation at a stated memory address involving a stated data value; timecodes may be implemented, e.g., as clock ticks or instruction counters; some traces may contain a unique timecode for each recorded operation, but timecodes may also be repeated or omitted in some trace data
428 gap in timecodes in trace to indicate expressly or implicitly execution time points where tracing was not performed (e.g., ranges when tracing was disabled for a thread or processing unit). This may include any gap where adjacent timecodes differ by more than the default or specified increment (normally one), e.g., the timecode sequence 2, 3, 4, 300, 301, 302 has a gap between 4 and 300, and the timecode sequence 250, 500, 750, 1000, 2000, 2250, 2500 has a gap between 1000 and 2000.
430 index into data in trace file, e.g., reverse-lookup data structures for quickly identifying trace attributes, memory lifetime indexing information, and other searchable lists of locations in the trace data that may be of particular interest
432 key frames in trace data; e.g., may exist at regular intervals in trace data to permit replay to more quickly jump to replay of the trace at (or near) the key frame
434 executed code, e.g., opcodes and arguments of machine-level code of a debuggee that was executed by a processor as the debuggee ran and was being traced
436 stack activity that occurred as the debuggee ran and was being traced, e.g., stack growth, stack shrinkage, and the execution time points at which this activity occurred
438 data streams; may correspond to an individual thread or set of threads, may correspond to a processor unit (e.g., a processor core); may correspond to all cores in a given processor socket; may be annotated with metadata to aid replay 440 processor core activity that occurred as the debuggee ran and was being traced, e.g., opcodes and arguments of instructions executed by the core 442 processor socket activity that occurred as the debuggee ran and was being traced, e.g., opcodes and arguments of instructions executed by any core located in a given processor socket 444 thread activity that occurred as the debuggee ran and was being traced, e.g., instructions executed while the thread was running, memory cell accesses made while the thread was running, associated metadata such as thread ID and timecodes 446 register activity that occurred as the debuggee ran and was being traced, e.g., what value was read from which register at what timecode, what value was written to which register at what timecode 448 memory address 450 instruction op code 452 data value 454 trace data generally 456 tuple, namely, two or more items of trace data which are associated in the trace as representing the same operation during the traced execution; e.g., a memory read operation or a memory write operation may be recorded on a single line in a trace as a tuple which contains or otherwise associates together an op code (e.g., read or write), an address (e.g., a RAM address or register ID), and the data value that was read or written 502 memory cell, e.g., byte or word in RAM or in ROM, processor register, cache line, or other addressable unit of memory 504 stack, e.g., a portion of memory where state information is pushed when a routine is entered and then popped as control returns from the routine to the code that called the routine; often distinguished from heap memory 506 stack base address which defines a starting point from which stack is allocated in contiguous pieces of memory; stacks are assumed to grow in a known direction by allocation of stack memory in a system, which may be an upward direction (i.e., addresses increase as items are pushed on the stack) in a given system but may also be downward (i.e., addresses decrease as items are pushed on the stack) in another system; the term "growthward" herein means in the direction of stack growth on the system in question, and "shrinkward" means in the opposite direction 508 stack frame, a.k.a. allocation record, which is allocated on the stack when a routine is called; typically contains a return address identifying a location in the code where execution will resume when the routine returns; may also hold values passed as parameters to the routine when the routine is called, or the address of such parameter values 510 heap memory which is allocated and deallocated as objects are constructed and freed; in some cases, a heap may be subject to automatic garbage collection, which identifies and marks as available memory that hold objects no longer reachable during live execution of a process; in other cases, memory allocated from a heap requires a separate, explicit call to free that allocated memory.

512 object 514 cache memory; may be in RAM working memory or onboard a processor chip, for example 516 register in a processor core 518 object property; a named value which is a constituent of an object; may be a function, in which case the property is often referred to as a method; also refers to function that implements an object property 520 ROM (read-only memory); typically non-volatile 522 nonvolatile memory other than onboard ROM, such as removable flash memory, magnetic or optical disk storage, tape storage, etc.

524 RAM (random access memory); typically volatile 526 local memory, e.g., memory which is local to a stated or implied context such as local to a routine during the routine's execution and then freed, or local to a thread 528 global memory, e.g., memory which is global to a stated or implied context such as global to a set of multiple routines during the execution of any of them, or global to a set of threads 530 characteristic of memory which increases or decreases likelihood that an entity external to a thread will alter the value stored in the memory cell, e.g., whether the memory cell is write-protected with respect to other threads, whether it is in shared memory such as memory that is global to multiple threads 602 memory cell specification, e.g., an address in ROM or RAM or cache, or a register ID, or another item that specifies a memory cell by distinguishing it from other memory cells to permit access (read or write, or reasonable attempt to read or write) to that memory cell; may also specify multiple memory cells, e.g., as a range of addresses 604 register ID, e.g., register name, or index into an array of registers 606 address range, namely, a set of adjacent addresses identifying a corresponding set of contiguous memory cells; as an example, a range may be specified as a pair of addresses (high address and low address); as another example, a range may be specified as a base address and a count of contiguous cells based on the base address 608 specification of one or more execution time points, e.g., as a particular timecode, or a range of timecodes; a range may be specified as a pair of timecodes (start timecode and end timecode) or a range may be specified as a base timecode and a count of timecode increments such as a number of clock ticks or a number of instructions 610 instruction count, usable as a timecode; may be an absolute count from when a process began execution or a relative count such as from when a thread resumed execution 612 system clock value, e.g., in milliseconds or CPU cycles 614 execution time range specification, i.e., data which specifies a range of execution time points; may be implemented, e.g., as a pair of timecodes (start and end) or as a base timecode and a count of timecode increments based on the base timecode 616 execution time point 618 acceptable level of uncertainty; may be numeric corresponding to examples discussed below for item 702, or may be expressed in terms of acceptable/unacceptable grounds or heuristics 702 heuristically-derived value of a memory cell at a particular execution time, based on trace data; the derived value may be the actual value or an approximation of the actual value; the derived value may have an associated level of uncertainty. For example, the level of uncertainty may be represented by a floating point value in the range from zero (complete certainty because the trace contains an express read or write of the derived value from/to the memory cell at the particular time) to one (complete uncertainty because the trace contains no information about values of the memory cell at any point in time). In another example, the level of uncertainty may be represented by a range of integer values, such as 32-bit values from 0 through 0x12345678, as used herein, "derived value" means a value, derived from trace data by applying one or more heuristics as taught herein, where uncertainty as to the value exists; "derived value" and "heuristically-derived value" mean the same thing and may be used interchangeably within this application.

704 respective ground for a value produced as the possible or actual value of a respective memory cell at a particular execution time; when multiple memory cells are queried, they may have the same or different respective grounds for their respective values; a respective ground indicates the basis for a value produced, such as indicating that the value is a known-current-value or indicating the name or other identifier of one or more heuristics whose application to the trace yielded the value; grounds may optionally include an enumeration value (e.g., "likely accurate" or "low accuracy") or a float value or an integer value representing the level of uncertainty (or equivalently the level of certainty) associated with the value 706 blended ground, namely, a ground obtained by applying a ranking or other resolution procedure to multiple respective grounds of multiple heuristically-derived values of respective memory cells to select a single ground associated with the memory cells as a group; for example, a string may have a blended ground based on the respective grounds of the derived values of the individual character memory cells constituting the string in memory 708 the known current value of a memory cell at a particular execution time, which is known from the trace with zero uncertainty. For example, the known current value may be returned in place of a heuristically-derived value where the trace includes an express read or express write of the value from/to the memory cell at the particular execution time.

Figure 8:
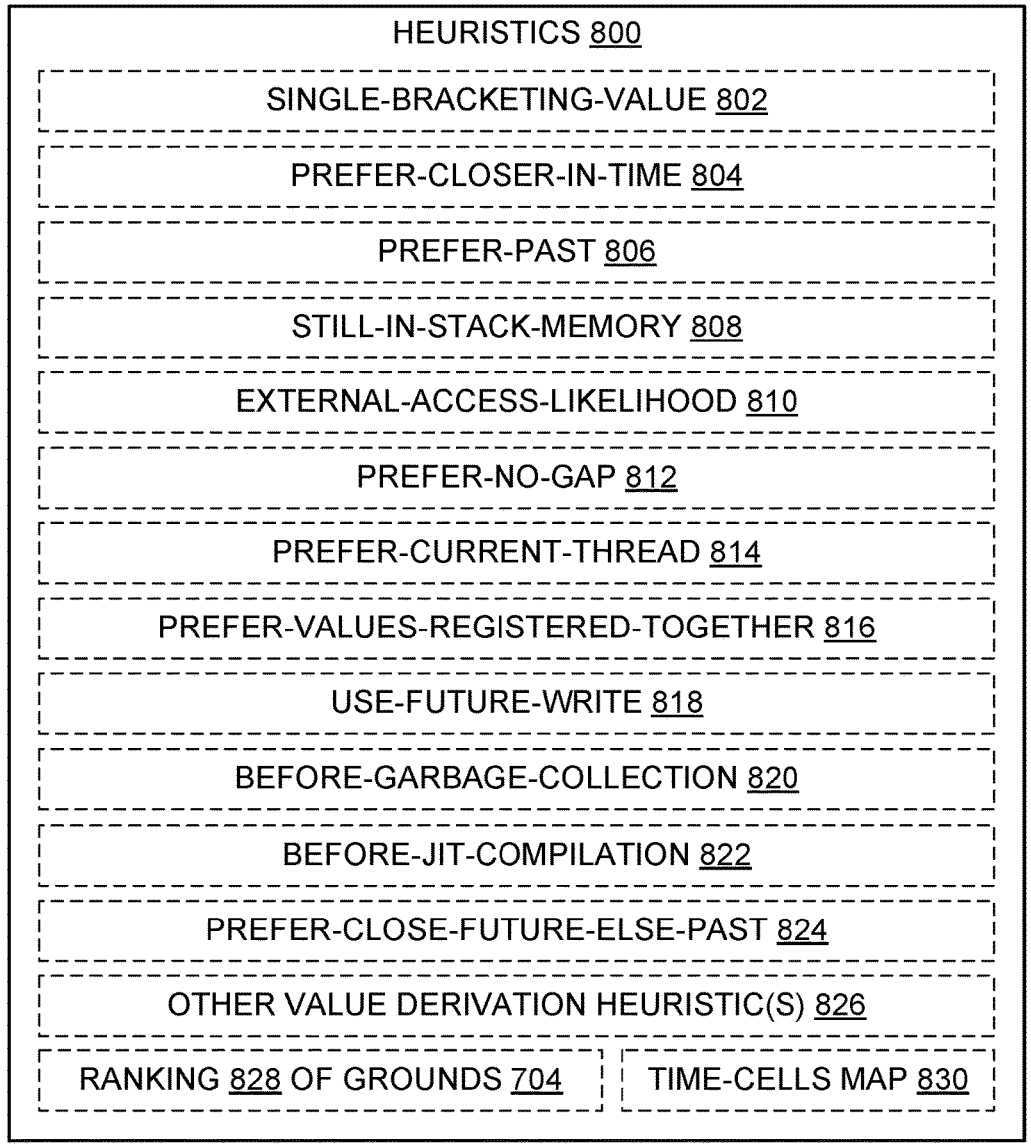
FIG. 8 is a block diagram illustrating memory cell trace-based value derivation heuristics.

800 heuristics, namely, a procedure, process, method, algorithm, or other set or sequence of steps which produces a derived value for the content of a memory cell at a particular execution time based on a trace, when the trace does not contain a known current value expressly stating the value of the content of the memory cell at the particular time; "heuristic" may also refer to a computer implementation capable of carrying out such a procedure, process, method, algorithm, or other set or sequence of steps to produce a derived value for the content of a memory cell at a particular time based on a trace; although dashed lines in FIG. 8 show that individual heuristics may be included in or omitted from a given embodiment, it is assumed herein that any embodiment which includes heuristic computation code 412 or is described as performing a heuristic, for example, includes or utilizes at least one heuristic and therefore the box for heuristics 800 shows a solid line 802 a single-bracketing-value heuristic as illustrated or otherwise described herein 804 a prefer-closer-in-time heuristic as illustrated or otherwise described herein 806 a prefer-past heuristic as illustrated or otherwise described herein 808 a stack-memory heuristic as illustrated or otherwise described herein 810 an external-access-likelihood heuristic as illustrated or otherwise described herein 812 a prefer-no-gap heuristic as illustrated or otherwise described herein 814 a prefer-current-thread heuristic as illustrated or otherwise described herein 816 a prefer-values-registered-together heuristic as illustrated or otherwise described herein 818 a use-future-write heuristic as illustrated or otherwise described herein 820 a before-garbage-collection heuristic as illustrated or otherwise described herein 822 a before-jit-compilation heuristic as illustrated or otherwise described herein 824 a prefer-close-future-else-past heuristic as illustrated or otherwise described herein 826 other trace-based memory cell value derivation heuristics, including, e.g., analogues of the before-garbage-collection and before-jit-compilation heuristics which check for other computations that may alter memory by way of analogy to garbage collection and jit compilation, and variations such as preferring a smaller gap or preferring fewer gaps instead of preferring no gap 828 a ranking of grounds for derived values; in addition to other rankings used herein as examples, this may include ranking all or a subset of the heuristics 802-826, e.g., by preferring those which are faster to compute, or preferring those which have been tested in a given environment and found to be more accurate 830 map which associates a particular execution time t with derived values for memory cells based on a trace 902 thread 904 thread ID 906 thread status, e.g., created, runnable, running, suspended, blocked, terminated 908 thread code, namely, code which executed or which may execute when a thread runs 910 thread memory, e.g., memory which is local to a thread, or memory that is global to the thread and is accessed by the thread as the thread executes 1000 example of a trace-based memory inspection process 1002 receiving a query 1004 specifying one or more memory cells and one or more execution time points 1006 executing code which implements one or more heuristics 800

1008 computing derived value(s) and their ground(s) by running code which implements one or more heuristics 800

1010 searching a trace 1012 state information in a trace, e.g., one or more instances of one or more of the items 422-454

1014 obtaining results of a computation 1008

1016 results of a computation 1008

1018 reporting computation results, e.g., in a response 216 to a debugger 1020 utilize results of memory inspection, e.g., in a debugger 1022 update a debugger or other tool user interface 1024 assist debugging by providing trace-based state information 1026 perform debugging 1028 analyze a debuggee or other program using a trace of the program's execution 1030 perform resource usage profiling 1032 perform security testing, e.g., feeding an execution replay SQL injection attempts or other malicious or randomized input 1034 inspect memory using a trace, e.g., execute a query for a memory cell's value at execution time t by searching the trace and applying a heuristic to the search results 1036 determine the trace does not contain an express value, e.g., read or write of the memory cell, at the particular execution time sought 1100 example of a trace-based memory inspection process tailored for use inspecting multiple cells 1102 string; also refers to the contiguous memory cells used to store the values that constitute the value of the string 1104 blend multiple grounds to create a blended ground, e.g., by selecting a ground using a ranking 828

1106 select a ground, e.g., by selecting most pessimistic ground (i.e., the ground, in a group of applicable grounds, which promises the least about the accuracy of the accompanying heuristically-derived value), ground that is most computationally efficient to compute, or ground that is deemed most likely to be accurate 1200 example of a trace-based memory inspection process tailored for inspecting an object's property value when that property value is a calculated value 1202 calculation of an object's property value 1204 reading one or more memory cells that are used in calculation of an object's property value, e.g., read inside a function that implements the property 1206 executing a function that implements an object property 1606 estimate of the likelihood that a memory cell having a specified characteristic will be accessed by an external thread 1912 a prefer close past value variant of the prefer-closer-in-time heuristic 1914 a prefer close future value variant of the prefer-closer-in-time heuristic 2408 delta used in prefer-close-future-else-past heuristic The following reference numerals denote heuristic steps which are described in detail in the Figures and in text herein: 1302, 1304, 1306, 1402, 1404, 1406, 1502, 1602, 1604, 1608, 1702, 1704, 1706, 1802, 1804, 1902, 1904, 1906, 1908, 1910, 2002, 2004, 2006, 2008, 2010, 2102, 2104, 2106, 2202, 2204, 2206, 2208, 2302, 2304, 2306, 2308, 2402, 2404, 2502, 2504

The following reference numerals denote flowcharts which are shown in the Figures, and may also refer to the computer-implemented process, heuristic, computation, computer-implemented computation illustrated in the flowchart: 1000, 1100, 1200, 1300, 1400, 1500, 1600, 1700, 1800, 1900, 2000, 2100, 2200, 2300, 2400, 2500

Operating Environments

With reference to FIG. 1, an operating environment 100 for an embodiment includes at least one computer system 102. The computer system 102 may be a multiprocessor computer system, or not. An operating environment may include one or more machines in a given computer system, which may be clustered, client-server networked, and/or peer-to-peer networked within a cloud. An individual machine is a computer system, and a group of cooperating machines is also a computer system. A given computer system 102 may be configured for end-users, e.g., with applications, for administrators, as a server, as a distributed processing node, and/or in other ways.

Human users 104 may interact with the computer system 102 by using displays, keyboards, and other peripherals 106, via typed text, touch, voice, movement, computer vision, gestures, and/or other forms of I/O. A screen 126 may be a removable peripheral 106 or may be an integral part of the system 102. A user interface may support interaction between an embodiment and one or more human users. A user interface may include a command line interface, a graphical user interface (GUI), natural user interface (NUI), voice command interface, and/or other user interface (UI) presentations, which may be presented as distinct options or may be integrated.

System administrators, network administrators, software developers, engineers, and end-users are each a particular type of user 104. Automated agents, scripts, playback software, and the like acting on behalf of one or more people may also be users 104. Storage devices and/or networking devices may be considered peripheral equipment in some embodiments and part of a system 102 in other embodiments, depending on their detachability from the processor 110. Other computer systems not shown in FIG. 1 may interact in technological ways with the computer system 102 or with another system embodiment using one or more connections to a network 108 via network interface equipment, for example.

Each computer system 102 includes at least one processor 110. The computer system 102, like other suitable systems, also includes one or more computer-readable storage media 112. Media 112 may be of different physical types. The media 112 may be volatile memory, non-volatile memory, fixed in place media, removable media, magnetic media, optical media, solid-state media, and/or of other types of physical durable storage media (as opposed to merely a propagated signal). In particular, a configured medium 114 such as a portable (i.e., external) hard drive, CD, DVD, memory stick, or other removable non-volatile memory medium may become functionally a technological part of the computer system when inserted or otherwise installed, making its content accessible for interaction with and use by processor 110. The removable configured medium 114 is an example of a computer-readable storage medium 112. Some other examples of computer-readable storage media 112 include built-in RAM, ROM, hard disks, and other memory storage devices which are not readily removable by users 104. For compliance with current United States patent requirements, neither a computer-readable medium nor a computer-readable storage medium nor a computer-readable memory is a signal per se or mere energy under any claim pending or granted in the United States.

The medium 114 is configured with binary instructions 116 that are executable by a processor 110; "executable" is used in a broad sense herein to include machine code, interpretable code, bytecode, and/or code that runs on a virtual machine, for example. The medium 114 is also configured with data 118 which is created, modified, referenced, and/or otherwise used for technical effect by execution of the instructions 116. The instructions 116 and the data 118 configure the memory or other storage medium 114 in which they reside; when that memory or other computer readable storage medium is a functional part of a given computer system, the instructions 116 and data 118 also configure that computer system. In some embodiments, a portion of the data 118 is representative of real-world items such as product characteristics, inventories, physical measurements, settings, images, readings, targets, volumes, and so forth. Such data is also transformed by backup, restore, commits, aborts, reformatting, and/or other technical operations.

Although an embodiment may be described as being implemented as software instructions executed by one or more processors in a computing device (e.g., general purpose computer, server, or cluster), such description is not meant to exhaust all possible embodiments. One of skill will understand that the same or similar functionality can also often be implemented, in whole or in part, directly in hardware logic, to provide the same or similar technical effects. Alternatively, or in addition to software implementation, the technical functionality described herein can be performed, at least in part, by one or more hardware logic components. For example, and without excluding other implementations, an embodiment may include hardware logic components 110, 128 such as Field-Programmable Gate Arrays (FPGAs), Application-Specific Integrated Circuits (ASICs), Application-Specific Standard Products (ASSPs), System-on-a-Chip components (SOCs), Complex Programmable Logic Devices (CPLDs), and similar components. Components of an embodiment may be grouped into interacting functional modules based on their inputs, outputs, and/or their technical effects, for example.

In addition to processors 110 (e.g., CPUs, ALUs, FPUs, and/or GPUs), memory/storage media 112, and displays 126, an operating environment may also include other hardware 128, such as batteries, buses, power supplies, wired and wireless network interface cards, for instance. The nouns "screen" and "display" are used interchangeably herein. A display 126 may include one or more touch screens, screens responsive to input from a pen or tablet, or screens which operate solely for output. In some embodiments peripherals 106 such as human user I/O devices (screen, keyboard, mouse, tablet, microphone, speaker, motion sensor, etc.) will be present in operable communication with one or more processors 110 and memory. Software processes may be users 104.

In some embodiments, the system includes multiple computers connected by a network 108. Networking interface equipment can provide access to networks 108, using components such as a packet-switched network interface card, a wireless transceiver, or a telephone network interface, for example, which may be present in a given computer system. However, an embodiment may also communicate technical data and/or technical instructions through direct memory access, removable nonvolatile media, or other information storage-retrieval and/or transmission approaches.

One of skill will appreciate that the foregoing aspects and other aspects presented herein under "Operating Environments" may form part of a given embodiment. This document's headings are not intended to provide a strict classification of features into embodiment and non-embodiment feature sets.

One or more items are shown in dashed-line form in the Figures, or listed inside parentheses, to emphasize that they are not necessarily part of the illustrated operating environment or part of all embodiments, but may interoperate with items in the operating environment or some embodiments as discussed herein. It does not follow that items not in dashed-line or parenthetical form are necessarily required, in any Figure or any embodiment. In particular, FIG. 1 is provided for convenience; inclusion of an item in FIG. 1 does not imply that the item, or the described use of the item, was known prior to the current innovations.

Debugging Environments

Figure 2:
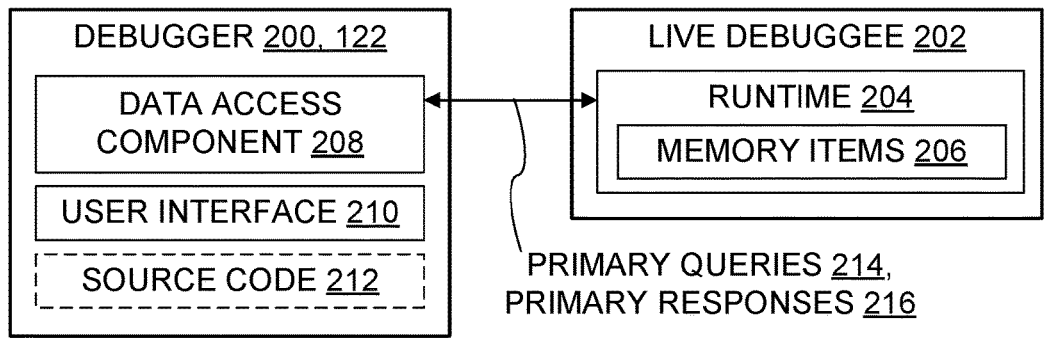
FIG. 2 is a block diagram illustrating aspects of live process debugging.

FIG. 2 illustrates a live process debugging environment, which is an example of operating environment 100. A debugger 200 contains various components, not all of which are shown here, since many are well-known. The main use of memory inspection as taught herein may be in environments in which live process debugging is not feasible or at least is undesirable. Nonetheless, live process debugging is shown, both for context and because it can be combined with trace-based debugging.

The debugger 200 may be a conventional debugger, or it may be adapted to perform memory inspection as taught herein. The illustrated debugger includes a data access component 208 (DAC). In this live debugging environment, the DAC 208 communicates with a runtime 204 of the debuggee process 202, by using primary queries 214 to the runtime and primary responses 216 from the runtime to obtain state information 206. The debugger then updates its user interface 210 accordingly. The user interface presents state information at a relatively high level, e.g., in terms of artifacts defined in source code 212. However, one of skill will appreciate that a DAC 208 is not required for application of the heuristics 800 taught herein. A DAC is useful when debugging managed (e.g., garbage-collected via runtime) processes, but the heuristics 800 can also be applied to native (no runtime or system-provided garbage collection) processes. Adaptations to native code use will be clear, e.g., the before-garbage-collection heuristic 820 does not apply when there is no garbage collection.

Figure 3:
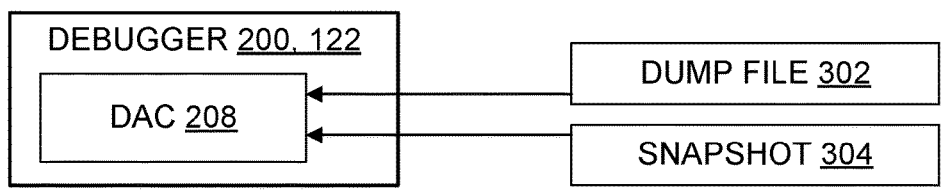
FIG. 3 is a block diagram illustrating aspects of debugging based on a copy of memory that was made at a single particular point in time.

FIG. 3 illustrates a dump debugging environment, which is another example of operating environment 100. A debugger 200 uses its data access component 208 or functionally similar code to read, from a dump file 302 or a snapshot 304 or both, memory contents and other state information for a particular point of time in the execution of a debuggee.

FIG. 4 illustrates a trace-based debugging environment, which is another example of operating environment 100. The illustrated debugger 200 works with, or includes (since the scope of the debugger may be defined, e.g., by a given developer to include the DAC adapter) technical adaptations which permit the debugger to interact with a trace 418 more or less as if the debugger was instead interacting with a runtime. For example, the same format may be used, in this example, for primary queries 214 and primary responses 216 that was used in the live process debugging environment of FIG. 2. However, trace-based debugging may provide developers with less flexibility than live process debugging in that variables and other memory contents that are accessible through a runtime are not necessarily readable from a trace.

On the other hand, trace-based debugging with suitable execution control 402 code, replay code 406, and mappings 404 between low-level trace data 422 and high-level code 212 can support reverse execution in the form of reverse replay of a traced execution. In live debugging, by contrast, a debuggee does not normally execute in reverse.

The illustrated DAC adapter 408 includes an interface 410 to the debugger, which in this example presents to the debugger an API that matches at least a subset of the API presented to a conventional debugger by a runtime 204 to support live process debugging. Other implementation approaches are also possible. For example, primary queries 214 from the replay component may specify an execution time t, and primary queries 214 from the data access component may specify a memory cell, in response 216 to which the DAC adapter may provide the value (actual or derived) of the memory cell at the time t, based on the trace data. Moreover, as indicated by the dashed line around the DAC adapter 408 in FIG. 4, some or all of the DAC adapter may be considered to be part of the debugger 200 in some implementations, in that the debugger is an adapted debugger 200 which contains one or more heuristic computation codes 412. For instance, one variation implements the primary queries 214 and primary responses 216 and query interface 410 as function calls and returns and interfaces within the debugger, as opposed to using external messages. In some variations, the debugger contains the heuristic computation codes 412, and there is no separate DAC adapter 408. The debugger heuristics codes 412 may work in conjunction with the DAC 208 to map addresses 448 to high-level objects 512.

Derived values are values provided using heuristics code 412. As a simple example, if the memory cell was given a value V at a prior execution time point tp, and the trace does not contain any other information about the memory cell between that prior execution time point and a current execution time point t, then the heuristic may provide V as a derived value for the memory cell at execution time t. V may also have been the actual value, but if the trace did not record all memory activity (which traces may avoid doing, to reduce execution delay or trace file storage size) then the actual value at the current execution time point t might not have been V. Even where all memory activity was recorded in a trace 418, there are situations where a last-known-value heuristic would be used. In other examples, a value stored in a trace checkpoint, process snapshot, or the like may provide predetermined values as either definitely known or based on a heuristic. In some implementations, a heuristic used for a predetermined value may be identified or correlated to the predetermined value in the trace.

FIG. 4 shows communication between the DAC adapter 408 and the trace 418 in the form of machine-level queries 414 and responses 416. This is one possible implementation, which as an example may use a trace reader (not shown) to receive and respond to the queries. However, in another implementation the machine-level queries 414 and responses 416 take the form of function calls within the DAC adapter 408, which include functions that read from the trace 418 and pass back to their caller information found in the trace.

As illustrated, a trace 418 may be stored in one or more files 420, and may include various kinds of trace data as well as metadata which facilitates or delimits searches of the trace data. Part or all of a trace 418 may also reside in RAM. Some examples of trace data include bit-accurate trace data 422 such as copies of low-level instructions and their operands, timecodes 424 which can be used to order trace data items relative to one another, memory snapshots 304 or dumps 302, indexes 430 into the raw trace data, key frames 432 inserted into raw trace data at specified intervals, copies of code 434 executed by the debuggee during tracing, stack activity 436, data streams 438 read or written by the debuggee while tracing, processor activity on a per-core 440 or per-socket (multiple cores) 442 basis, thread activity 444 while tracing, register reads and writes 446 while tracing, tuples 456 correlating a memory address 448 with an instruction 450 and one or more values 452 and optionally also with a timecode 424, and other 454 reads or writes or values or opcodes captured in a trace. The absence of certain data in a trace may also be considered state information, e.g., gaps 428 in a sequence of timecodes.

Figure 5:
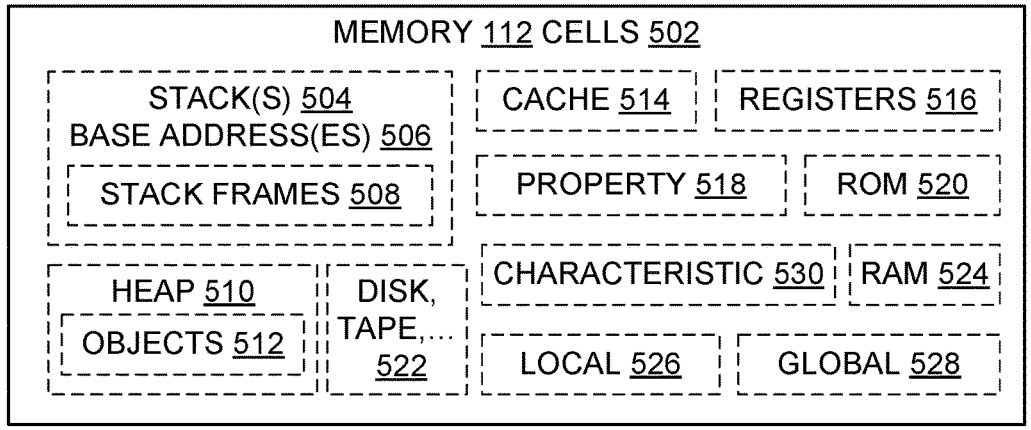
FIG. 5 is a block diagram illustrating various kinds of memory cells that may be referenced during debugging or referenced in a trace.

FIG. 5 illustrates various kinds of memory 112 that may be traced, and thus be subject to inspection according to teachings herein. Examples of memory cells 502 shown include stacks 504 (including data such as their base address 506 and allocated stack frames 508), heap contents 510 such as objects 512 or metadata such as garbage collection data, caches 514, processor registers 516, object members such as properties 518, addressable cells in ROM 520 or in RAM 524, removable or third-tier memory 522, local memory 526, and global memory 528. A memory cell may have one or more characteristics 530 which increase or reduce the accessibility of the memory cell, e.g., memory may be in kernel space, may be shared, may be subject to DMA, and so on.

Some embodiments consider a compacting garbage collection as a hard barrier and prefer values that do not cross that barrier. This is based on the realization that a compacting garbage collection often moves many items around in memory. However, if there is data in the trace 418 (or some auxiliary place) that tracks where a memory cell was moved, then that memory cell's location prior to the compacting garbage collection could be correlated to a disparate new location after the compacting garbage collection, and thus the heuristics could consider the prior location and new locations when reconstructing the state information for a given query 214.

Figure 6:
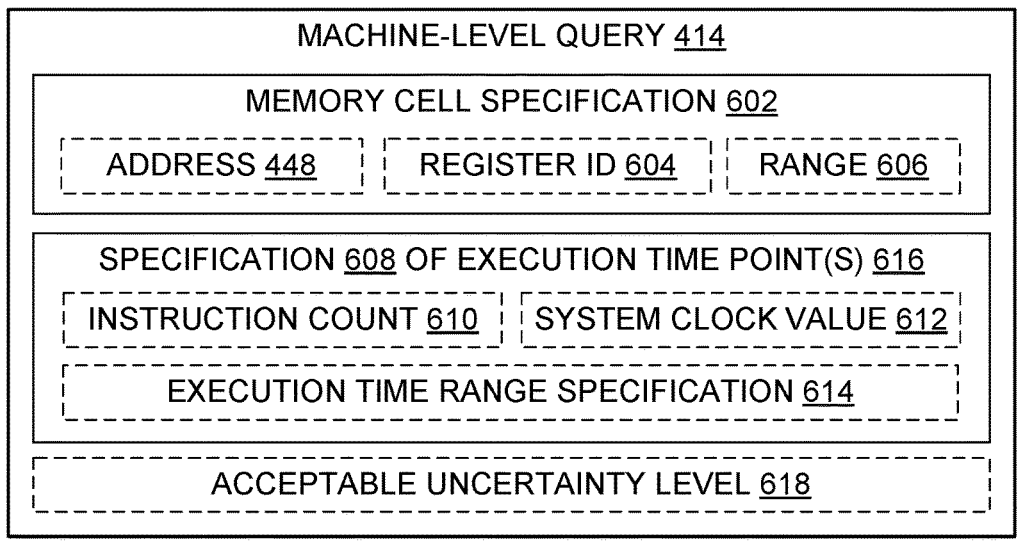
FIG. 6 is a block diagram illustrating machine-level queries that may seek information from an execution trace.

FIG. 6 illustrates content of machine-level queries 414. As noted, these queries may be implemented using communication data structures, or they may be implemented as parameters of routines. Some examples of the content in machine-level queries 414 are memory cell specifications 602 and specifications 608 of one or more execution time points 616. Memory cells 502 may be specified, e.g., as a single address 448, as a range 606 of addresses, or as a register name 604. Timecodes 424 may be specified, e.g., as an instruction count 610, or as a system clock value 612, and the specification may be for a single particular execution time point 616 (a point during the tracing) or for a range of execution time 614 (a.k.a. a span or period or interval of execution time during the tracing).

Figure 7:
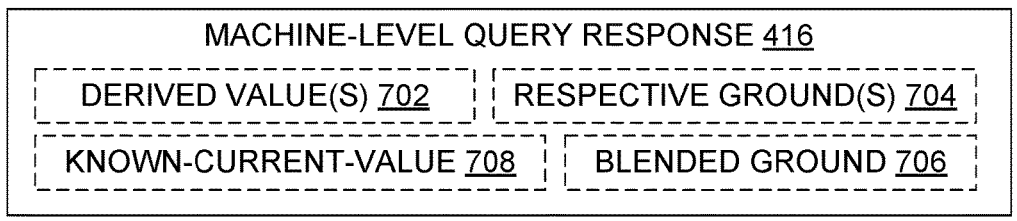
FIG. 7 is a block diagram illustrating responses to machine-level queries.

FIG. 7 illustrates content of machine-level query responses 416. As noted, these query responses may be implemented using communication data structures, or they may be implemented as function return values or side-effects of routines. Some examples of the content in machine-level query responses 416 are derived values 702 or known values 708 for one or more memory cells specified in the corresponding query 414, grounds 704 that indicate the reasoning and decisions made in producing the value(s) 702 or 708, and a blended ground 706 which pertains to multiple memory cells produced together in a response (e.g., a string).

A query 214 may ask for a value that is based on a range 606 of addresses instead of a single unit of addressable memory. This may produce a series of values in a memory segment, each of which may correspond to distinct timecodes (e.g., some values are from the past and some are from the future relative to the execution time t specified in the query).

A query 214 may specify 1004 contiguous memory across multiple addresses. For example, a system might only be able to perform an operation if it is able to read a particular data structure that might be, for example, 1 Kb in size. In order to give that 1 Kb of data, the trace memory inspection tool 122 in the system (or used by the system 102) can read the individual memory cells using one or more of the heuristics 800, and report 1018 a best-guess 702 of the full 1 Kb. If there are any memory cells 502 that the tool cannot retrieve, or which cannot be retrieved with less than a predetermined level 618 of uncertainty, some implementations may report 1018 that the memory is not available, and some implementations may provide an indication of which memory cells could not be retrieved (or had too large a level of uncertainty, or otherwise unacceptable uncertainty such as reliance on a disfavored heuristic), e.g., as an "unavailable" ground 704.

Another example is that the user interface 210 might generate a request for the value of a string 1102. Not all of the memory for the string may be available at the current location 424 in the trace 418, so the adapted tool 122 will fill in the string using one or more heuristics 800. Some of the characters in the string may come from the past, some may come from the future (although often they will all come from the past). Assume the following example configuration, where T means future, 'p' means past, and the ground 704 for a character is at the corresponding offset below the respective character:

Hello World
fffffppppp

The adapted tool 122 of this example can report the string as the "Next Known Value" in the user interface 210 because the letters of the word "Hello" are from the "future", and this implementation considers future values to be less reliable than past values; it takes the "most pessimistic" interpretation. Some embodiments prefer the current read time when the trace contains an express indication of the memory value at the current time t, which is the specified 1004 execution time point. An adapted tool 122 can report 1018 such strings as "Known" values.

FIG. 8 illustrates several heuristics, denoted at 802 through 826, which are discussed herein. Also shown is a ranking 828 of grounds, which may be used to select a derived value when different heuristics are applied and do not all yield the same derived value. Also shown is a map 830, which is a data structure that correlates a given execution time point or given execution time interval with a set of memory cell derived values for the specified execution time point(s).

Figure 9:
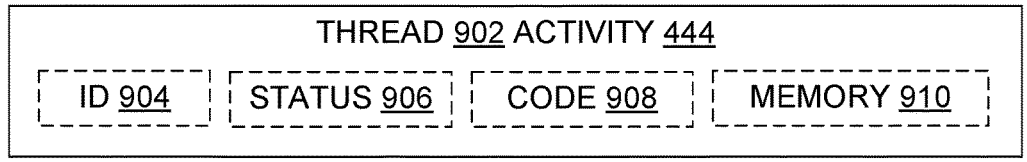
FIG. 9 is a block diagram illustrating aspects of thread trace data.

FIG. 9 shows thread 902 activity information 444 that may be captured in a given trace 418. Shown are a thread identifier 904, thread status indication 906, executable code 908 of the thread, and memory cell 502 state information 910 such as thread-local variables and their identifiers.

More About Systems

Examples are provided herein to help illustrate aspects of the technology, but the examples given within this document do not describe all of the possible embodiments. Embodiments are not limited to the specific implementations, arrangements, displays, features, approaches, or scenarios provided herein. A given embodiment may include additional or different technical features, mechanisms, sequences, or data structures, for instance, and may otherwise depart from the examples provided herein.

With reference to FIGS. 1-7, some embodiments use or provide a memory inspection system 102 which provides derived data values 702 from an execution trace 418, the memory inspection system including at least one processor 110, a digital memory 112 in operable communication with the processor, and a DAC adapter 408 which includes a heuristic computation code 412 and an interface 410. For example, this may be in response to queries 214 from a high-level debugger 200 or other tool 122 having a data access component (DAC) 208. The DAC adapter is configured to, upon execution by the processor, perform a process that includes the following: (a) receive in the interface a query 214 which specifies a memory cell 502 and an execution time point t 616, (b) determine automatically that the execution trace fails to expressly specify a known value for the memory cell at the execution time point t, (c) with the processor, execute the heuristic computation code, whereby the heuristic computation code produces a derived value 702 for the memory cell at the execution time point t based on information in the execution trace, and (d) provide in the interface a response 216 to the query, the response including the derived value together with an indication 704 that the value provided in the response for the memory cell at the time t has a non-zero level of uncertainty.

Figure 13:
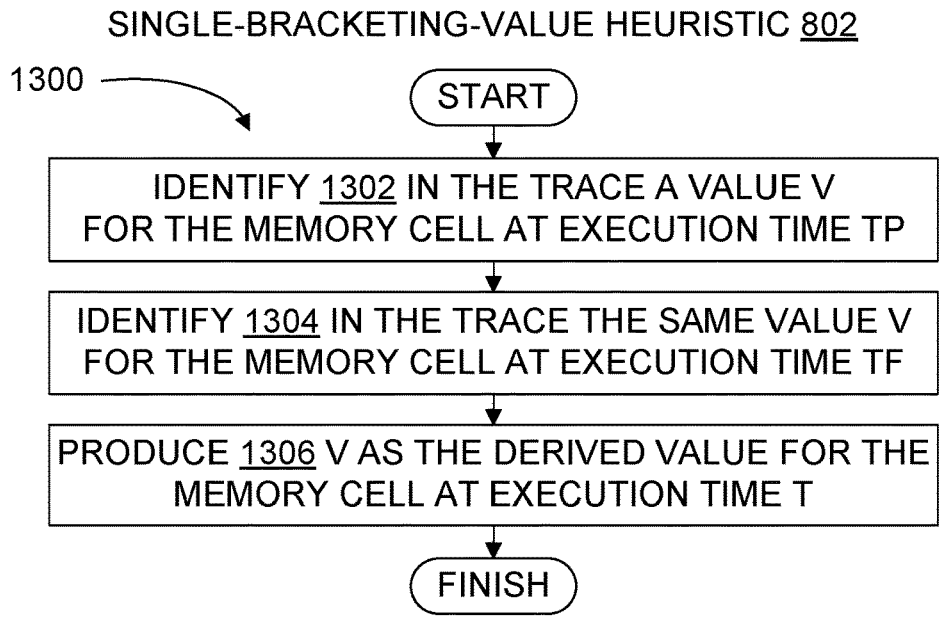
FIG. 13 is a flowchart illustrating a single-bracketing-value heuristic.

In some embodiments, and with reference now also to FIG. 13, the heuristic computation code 412 includes a single-bracketing-value heuristic 802 computation code which is configured to upon execution: identify 1302 in the execution trace a value v for the memory cell at an execution time point tp, identify 1304 in the execution trace the same value v for the memory cell at another execution time point tf which is later than the execution time point tp, and produce 1306 v as the derived value for the memory cell at an execution time point t, the execution time point t being after the execution time point tp and before the execution time point tf, the production of v based at least upon uncertainty as to the value of the memory cell at time t in view of the trace. In cases where the trace includes timecodes 424 that permit arithmetic with timecodes to identify execution points, tp may correspond to t−p and tf may correspond to t+f, where p>0, f>0, and p is not necessarily equal to f. In this context, a variation operates as follows: suppose there is a value for x at t−p and there is a value for x at t+f, and both values for x are equal. Report 1018 the value at t−p as the Last Known Value 704, that is, the value at the last time it was known.

Figure 14:
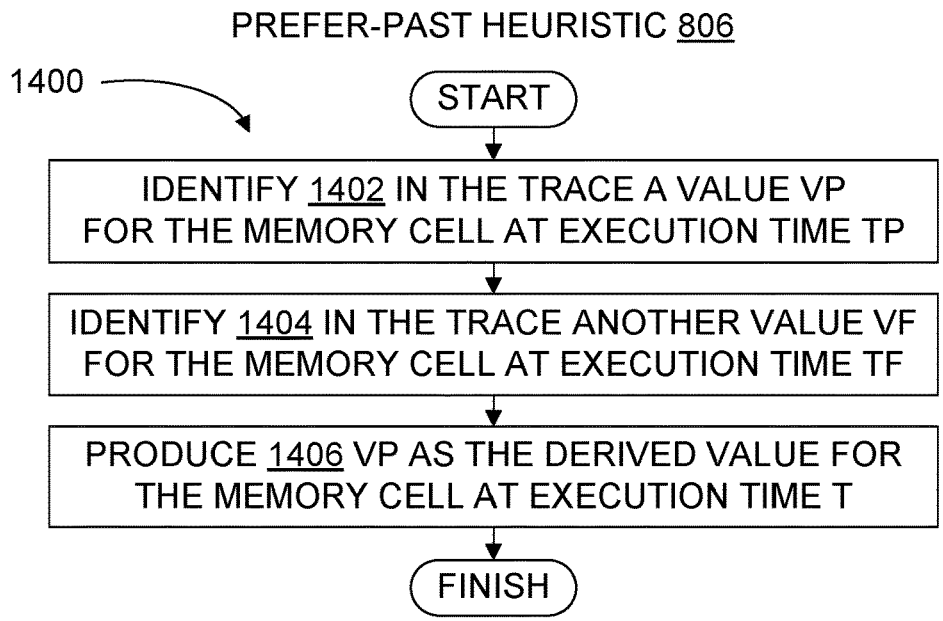
FIG. 14 is a flowchart illustrating a prefer-past heuristic.

In some embodiments, and with reference now also to FIG. 14, the heuristic computation code 412 includes a prefer-past heuristic 806 computation code which is configured to upon execution: identify 1402 in the execution trace a value vp for the memory cell at an execution time point tp, identify 1404 in the execution trace a value vf for the memory cell at another execution time point tf, where vp differs from vf (when vp equals vf, one may apply the single-bracketing-value heuristic 802), and produce 1406 vp as the derived value for the memory cell at an execution time point t, the execution time point t being after the execution time point tp and before the execution time point tf, the production of vp based at least upon uncertainty as to the value of the memory cell at time t in view of the trace. In cases where the trace includes timecodes 424 that permit arithmetic with timecodes to identify execution points, tp may correspond to t−p and tf may correspond to t+f, where p>0, f>0, and p is not necessarily equal to f.

Figure 15:
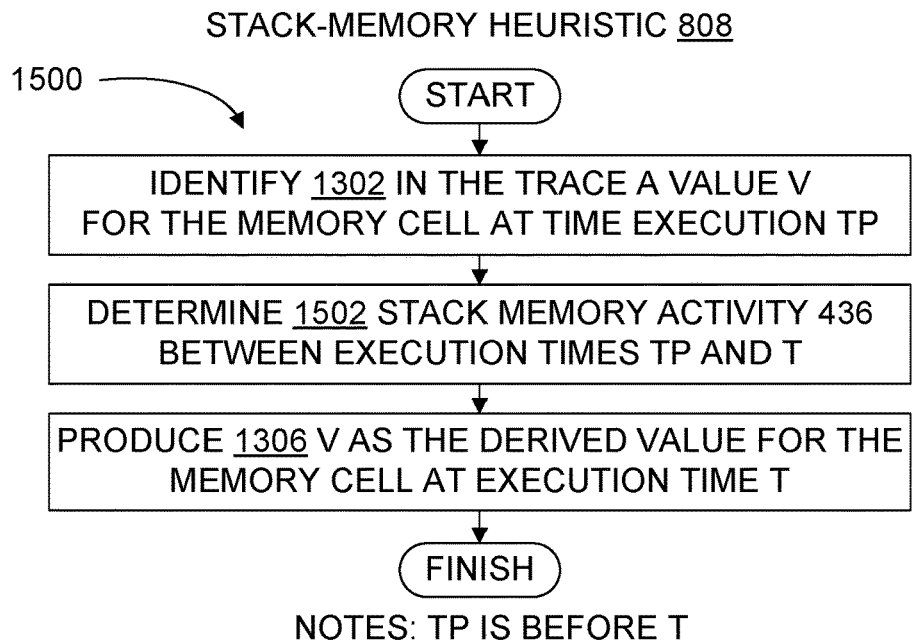
FIG. 15 is a flowchart illustrating a stack-memory heuristic.

In some embodiments, and with reference now also to FIG. 15, the heuristic computation code 412 includes a stack-memory heuristic 808 computation code. Consider the following scenario. The value of a memory cell at execution time t is sought. At a prior execution time tp, the value of the memory cell is known, and the memory cell was part of an allocated stack. At time t, the trace indicates the stack has shrunk and that the memory cell is no longer part of allocated stack memory. Then the memory cell may still contain at time t the value it had at prior time tp, so that value is returned as the heuristically-derived value, together with a ground indicating the circumstances (i.e., memory cell was in a stack, the stack shrank to exclude the memory cell, and in some cases that the stack has not grown enough to again include the cell).

In another related scenario, the trace shows that the stack shrank enough to remove the memory cell from allocated stack memory and then grew enough to again include the memory cell in allocated stack memory at or before execution time t, but the trace does not show any write to the memory cell after execution time tp. In this case, the memory cell's value at tp may be returned as a derived value, with grounds indicating the circumstances.

In any of these scenarios for the stack-memory heuristic 808, as with scenarios involving the other heuristics 800 described herein, there is uncertainty about the accuracy of a heuristically-derived value. As examples, the uncertainty may be due to gaps in the trace, or not every thread being traced, or not all traced events being ordered relative to one another. Heuristics 800 detect or assume uncertainty, and they are only applied in situations where there is some uncertainty about the actual value of a memory cell at the execution time t for which the cell's value is sought.

In some embodiments, the stack-memory heuristic 808 computation code is configured to upon execution: identify 1302 in the execution trace a value v for the memory cell at an execution time point tp in which the memory cell was part of an allocated stack, determine 1502 from the trace stack allocation activity 436 between execution time tp and an execution time point t that is later than the execution time point tp, and produce 1306 v as the derived value for the memory cell at the time t, together with grounds indicating the determined 1502 stack activity 436, the production of v based at least upon uncertainty as to the value of the memory cell at time t in view of the trace and the determined stack activity. In some embodiments and circumstances, the value at the execution time point tp is used even when the stack location was no longer a valid stack location between the execution time points tp and t. In cases where the trace includes timecodes 424 that permit arithmetic with timecodes to identify execution points, tp may correspond to t−p, where p>0. In some embodiments, if there is a value for x at some prior execution time point, and x is at an address on the stack 504 that is growthward of the current stack base 506, then the adapter reports 1018 the value at the prior execution time point tp.

Figure 16:
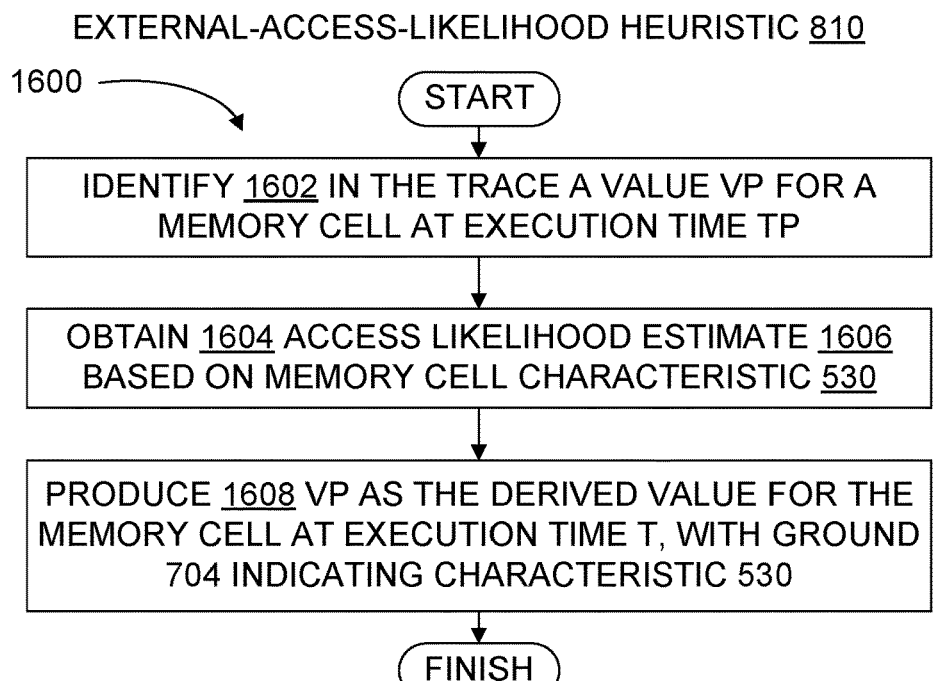
FIG. 16 is a flowchart illustrating an external-access-likelihood heuristic.

In some embodiments, and with reference now also to FIG. 16, the heuristic computation code 412 includes an external-access-likelihood heuristic 810. This heuristic 810 reflects the insight that in general, if an estimate is obtained that an entity external to a thread has accessed memory that comprises a given memory cell, then computations to heuristically derive a value of the memory cell at an execution time t can utilize that estimate. The access likelihood estimate may be based on characteristics of the memory cell. For example, it may be known from the trace or other data that the memory cell resides in a portion of memory that is sometimes subject to direct memory access (DMA) by one or more threads or interrupt handlers or device drivers. Or it may be known that the memory cell resides in a kernel address space, or is subject to Data Execution Prevention (DEP) or another executable space protection.

In some embodiments, the external-access-likelihood heuristic 810 computation code is configured to upon execution: identify 1602 in the execution trace a value vp for the memory cell at an execution time point tp which is prior to an execution time t, obtain 1604 an access likelihood estimate 1606 based on one or more characteristics 530 of the memory cell that the memory cell value was changed between tp and t, and produce 1608 vp as the heuristically-derived value for the memory cell at execution time point t, the execution time point t being after the execution time point tp, along with grounds indicating the characteristic(s) 530. The access likelihood estimate may be obtained, e.g., by looking up the characteristic in a table of administrator-defined access estimates. In cases where the trace includes timecodes 424 that permit arithmetic with timecodes to identify execution points, tp may correspond to t−p, where p>0.

Figure 17:
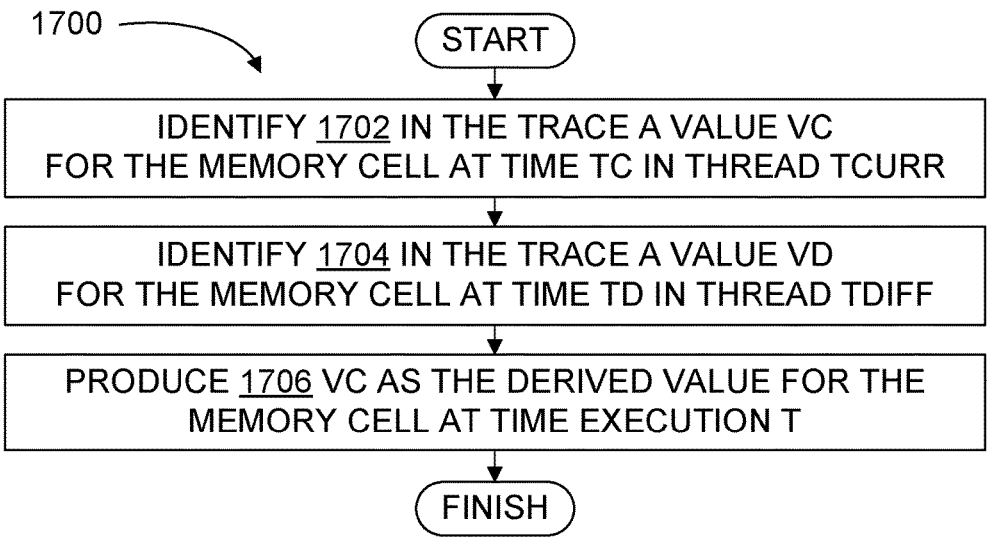
FIG. 17 is a flowchart illustrating a prefer-current-thread heuristic.

In some embodiments, and with reference now also to FIG. 17, the heuristic computation code 412 includes a prefer-current-thread heuristic 814 computation code which is configured to, upon execution: identify 1702 in the execution trace, for an execution time point tc of a thread tcurr, when the value of a memory cell at execution time t is sought, a value vc for the memory cell at tc, identify 1704 in the execution trace a value vd for the memory cell at an execution time point td of a thread tdiff which is a different thread than tcurr, and produce 1706 vc as the derived value for the memory cell at the execution time t based at least upon tcurr corresponding to the current thread for the execution time point t.

Some embodiments prefer values observed on the current thread. If a tool 122 requests the value for execution time point T at memory location x, and a search of the trace finds two possible values observed at execution time points T1 and T2, and T1 is observed on the same thread as was executing at T whereas T2 is observed on a different thread, then these embodiments prefer the value at T1 based at least upon T1 having been observed on the same thread as was executing at T.

Figure 19:
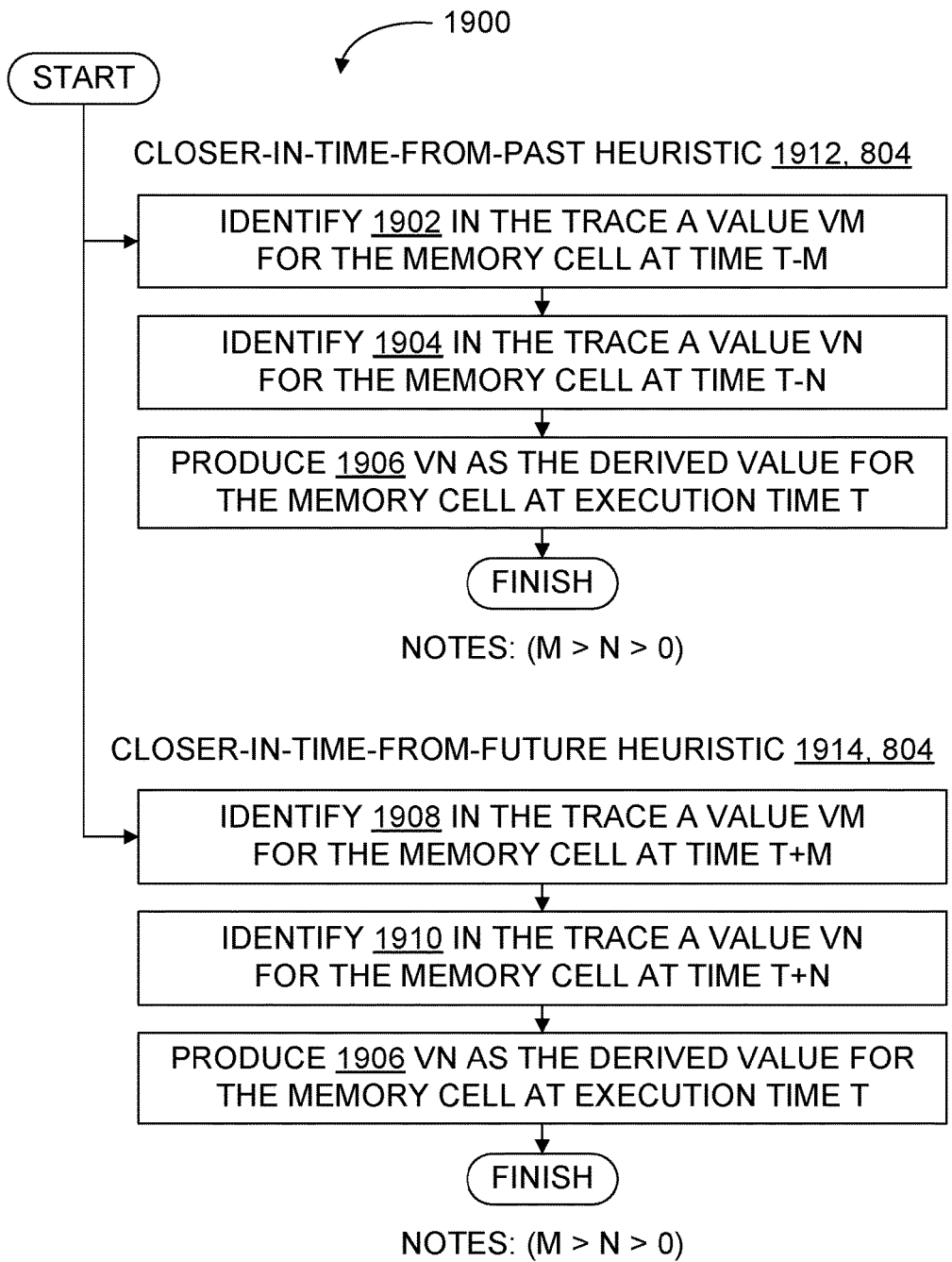
FIG. 19 is a flowchart illustrating two prefer-closer-in-time heuristics.

In some embodiments, and with reference now also to FIG. 19, the heuristic computation code includes a prefer-closer-in-time heuristic 804 computation code which is configured to upon execution perform at least one of the following: a closer-in-time-from-the-past heuristic 1912, or a closer-in-time-from-the-future heuristic 1914. The heuristics 804 involve not only the matter of whether one execution time point is prior to another execution time point, but also a measurement or other determination of which of two prior execution time points is closer to a query's execution time point t. The following description of an example of the prefer-closer-in-time heuristics 804 applies in embodiments where timecode arithmetic is available, e.g., closeness in execution time is determined by counting clock ticks or counting the number of instructions between two timecodes. However, one of skill can apply these heuristics 804 in other cases, using other measurements of execution time point closeness.

During execution of the closer-in-time-from-the-past heuristic 1912, the code 804 does the following: identify 1902 in the execution trace a value vm for the memory cell at an execution time point t−m, identify 1904 in the execution trace a value vn for the memory cell at an execution time point t−n, where m>n>0, and produce 1906 vn as the derived value for the memory cell at the time t. During execution of the closer-in-time-from-the-future heuristic 1914, the code 804 does the following: identify 1908 in the execution trace a value vm for the memory cell at an execution time point t+m, identify 1910 in the execution trace a value vn for the memory cell at an execution time point t+n, where m>n>0, and produce 1906 vn as the derived value for the memory cell at the time t. The production of vn is based at least upon uncertainty as to the value of the memory cell at time t in view of the trace.

Figure 20:
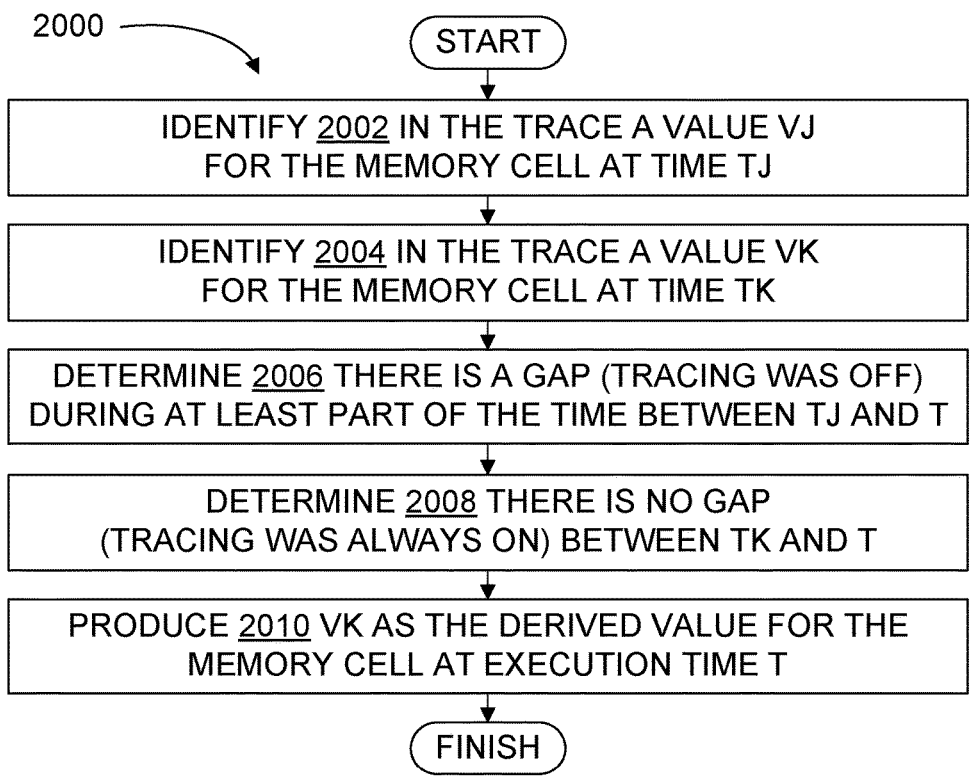
FIG. 20 is a flowchart illustrating a prefer-no-gap heuristic.

In some embodiments, and with reference now also to FIG. 20, the heuristic computation code 412 includes a prefer-no-gap heuristic 812 computation code which is configured to upon execution: identify 2002 in the execution trace a value vj for the memory cell at an execution time point tj, with tj prior to t, identify 2004 in the execution trace a value vk for the memory cell at an execution time point tk, with tk prior to t, determine 2006 that there is a tracing gap in the trace such that tracing did not occur for at least part of an interval between the execution times tj and t, determine 2008 that there is no tracing gap in the trace between the execution times tk and t, and produce 2010 vk as the derived value for the memory cell at the time t. Although time tj and tk are different from one another, and although each is prior to t, there is no requirement in this example that tj be prior to tk or that tk be prior to tj. Also, the production of vk is based at least upon uncertainty as to the value of the memory cell at time t in view of the trace.

Some embodiments prefer values with the least gaps. If a tool 122 requests the value on execution time point T at memory location x, and a search of the trace finds two possible values observed at execution time points T1 and T2, and there's a gap (skipped instructions, e.g., if tracing skipped jit-compiling a function) between T1 and T, but no gap between T2 and T, these embodiments prefer the value at T2.

One of skill will appreciate that other systems are also within the scope of the teachings presented here. In particular, other systems may use computation code which performs multiple heuristics, and other systems may use computation code which performs different heuristic(s) than the particular examples recited above. Systems or apparatus using any of the heuristics are within the present disclosure, including for example the heuristics shown in any one or more of FIGS. 13-24, regardless of whether they are among the examples above. Any claim consistent with the following form may be understood to be among the claims taught herein: A memory inspection system including heuristic computation code 412 which is configured to upon execution with a processor to perform <heuristics> where the material in brackets is replaced by one or more heuristic names of the heuristics 802-826, or by a description of one or more of the heuristics 802-826.

Methods

Figure 10:
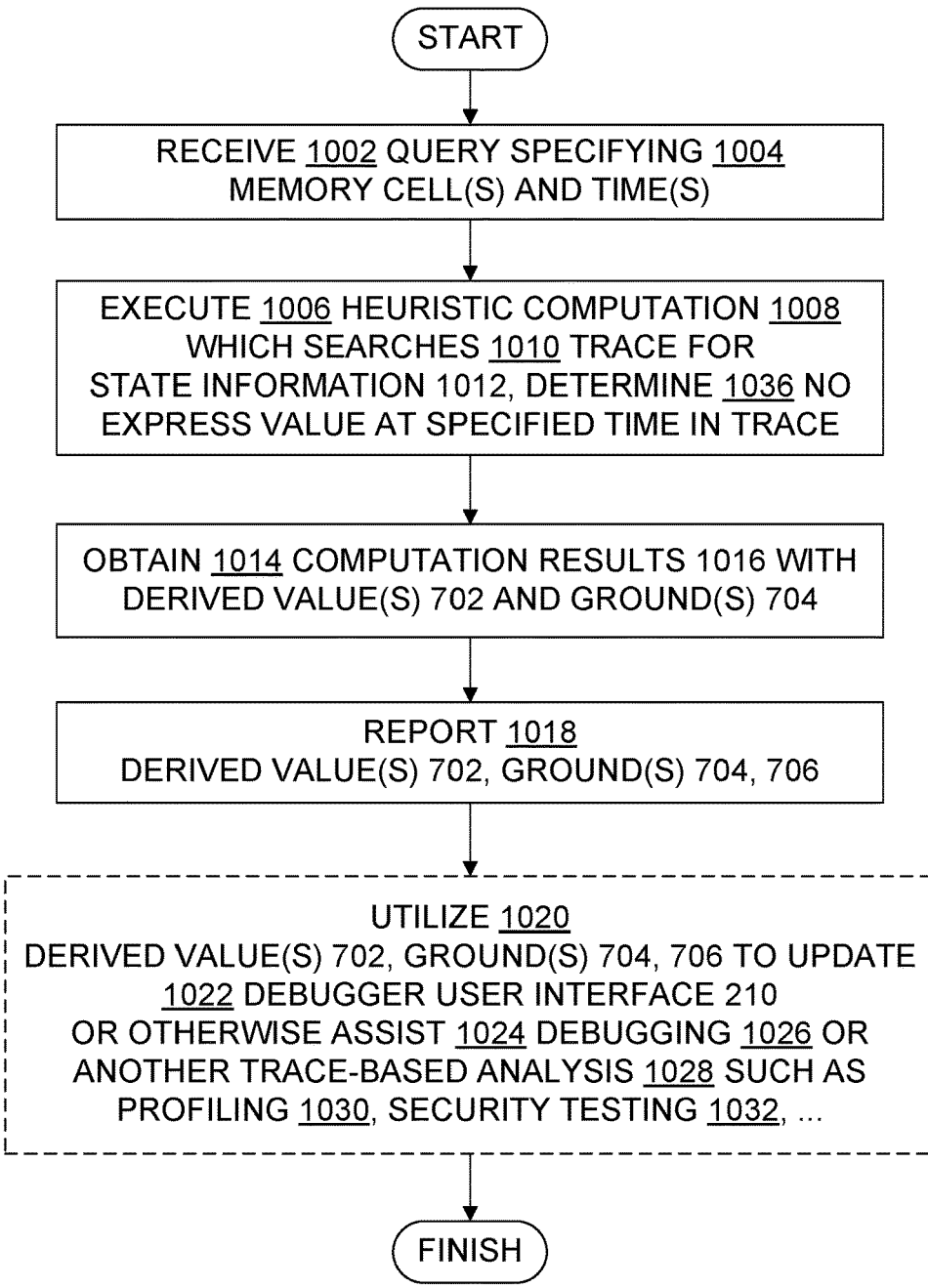
FIG. 10 is a flowchart illustrating an overview example of trace-based memory inspection methods.

FIG. 10 illustrates a memory inspection 1034 method 1000 which is an example of methods performed or assisted by a DAC adapter 408 or other system or apparatus utilizing one or more heuristic computation codes 412. This example method includes receiving 1002 a query specifying 1004 memory cell(s) and execution time point (s), executing 1006 one or more heuristic computations 1008 which search 1010 a trace 418 for state information 1012, obtaining 1014 computation results 1016 which include one or more memory cell derived values 702 for the specified 1004 cell(s) and execution time point (s) as well as ground(s) 704 for the derivations 702, and reporting 1018 the derived value(s) 702 and ground(s) 704 (possibly with or as a blended ground 706) to the debugger or other query source, whereupon it is used 1020 to update 1022 the debugger interface 210 or otherwise assist 1024 in a debugging 1026 session or in some other analysis 1028 (e.g., profiling 1030 or security testing 1032) based on the execution trace 418.

Figure 11:
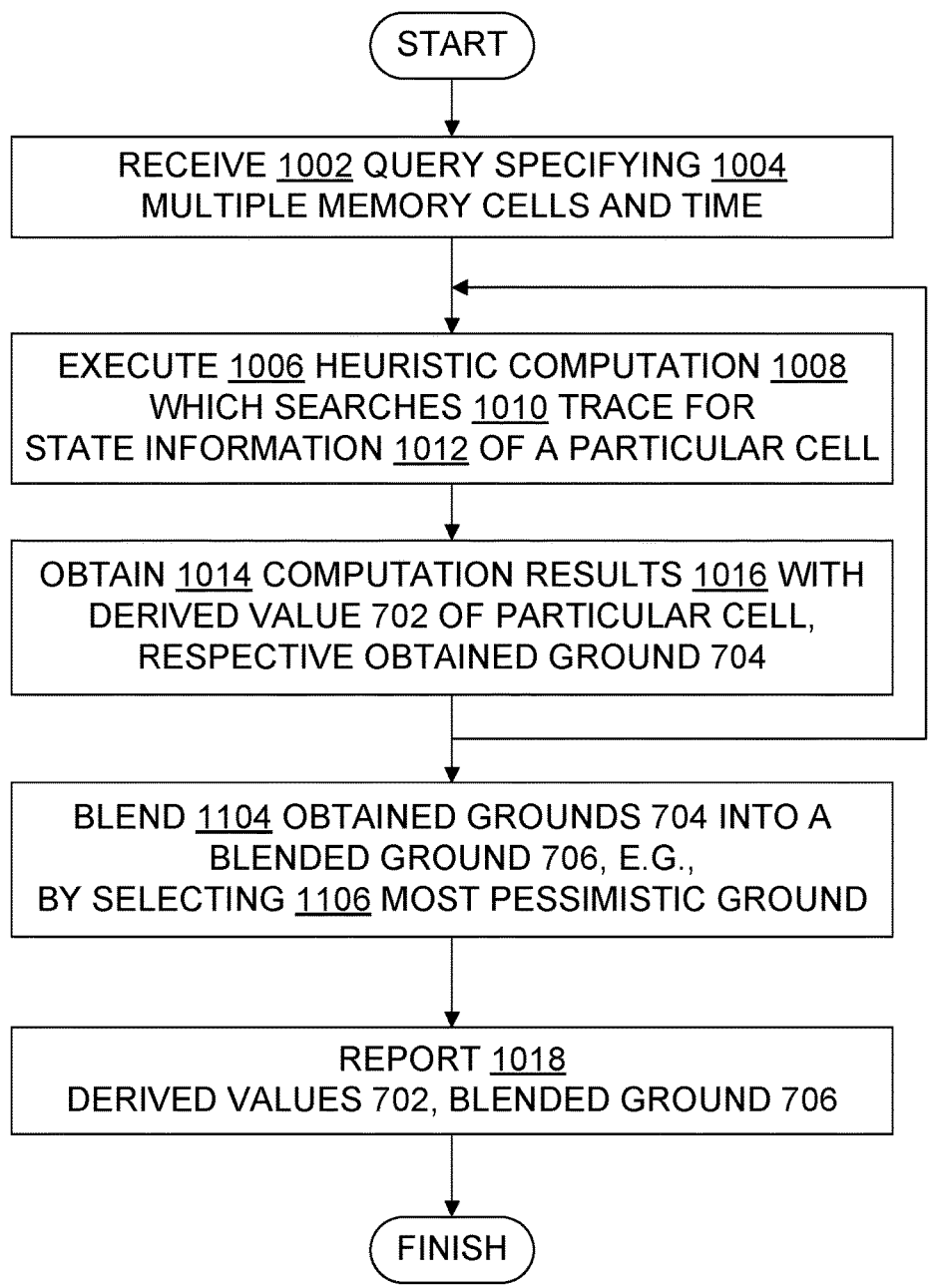
FIG. 11 is a flowchart illustrating an example of trace-based memory inspection methods useful for inspecting multiple cells such as those used in storing strings, arrays, structs, and objects that have multiple member variables.

FIG. 11 illustrates a memory inspection method 1100 which is suitable for inspecting 1034 multiple cells, particularly adjacent cells in a string 1102 or array. This example method 1100 includes receiving 1002 a query specifying 1004 multiple memory cells and an execution time t, executing 1006 for each cell or subset of cells a heuristic computation 1008 which searches 1010 the trace 418 for state information 1012, obtaining 1014 computation results 1016 which include with derived values 702 for the subset of cells and execution time t, as well as respective grounds 704 for the derivation 702, blending 1104 the respective grounds into a blended ground 706 (such as by selecting 1106 the most pessimistic of the grounds 704), and reporting 1018 the derived values 702 and at least the blended ground 706 to the debugger or other tool 122 that made the query. The querying tool can then use 1020 the derived values 702 and the blended ground 706 to assist 1024 a trace-based analysis 1028 of the traced program 124.

As an example, suppose the DAC 208 queries for an address range. Method 1100 may obtain a sequence of derived values 702 in a memory segment, some of which are from the past and some of which are from the future, relative to specified 1004 execution time t. Then a decision is implemented as to how to report 1018 this data. Some embodiments choose 1106 the "most pessimistic" option. In this example, the order 828 from most pessimistic to least is: missing data->future data->past data->current data.

So, suppose there is a memory range for which the query reports the following (where 'p' is past, 'f' is future, 'c' is current, and '?' is missing, and these grounds 704 correspond in position to the cells of a contiguous range of addresses).

pppfcfff?ppp

Then this implementation can report 1018 the data with "missing" as the blended ground 706.

Figure 12:
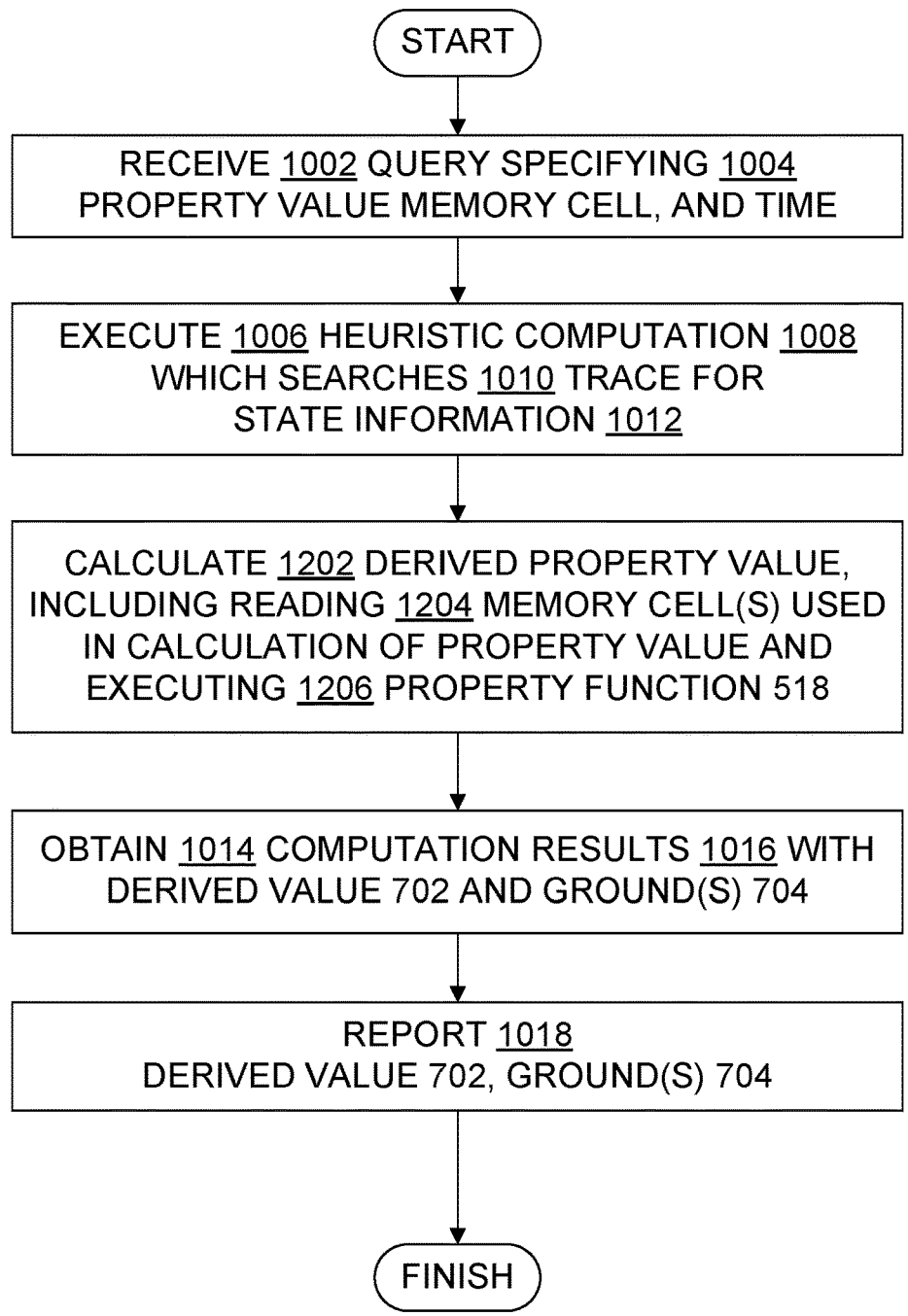
FIG. 12 is a flowchart illustrating an example of trace-based memory inspection methods useful for inspecting a calculated property of an object.

This set of respective grounds 704, on the other hand:

pppcpppp can be reported as the "Last Known Value", and this set:

pppfppffc can be reported as the "Next Known Value." FIG. 12 illustrates a memory inspection method 1200 which is suitable for inspecting a property 518 of an object 512, especially when the property's value is a calculated 1202 value. This example method 1200 includes receiving 1002 a query specifying 1004 a property value memory cell and an execution time t, executing 1006 a heuristic computation 1008 which searches 1010 the trace 418 for state information 1012, calculating 1202 a derived value 702 of the property by reading 1204 one or more memory cells that are used in the calculation of the property value (which may in turn include applying heuristics to obtain the values read) and executing 1206 the property calculation function 518, obtaining 1014 computation results 1016 which include a derived value 702 for the property and one or more grounds 704, 706 for that derivation 702, and reporting 1018 the derived values 702 and grounds 704, 706 to the debugger or other tool 122 that made the query. The querying tool can then use 1020 the derived property value 702 and ground(s) 704, 706 to assist 1024 debugging or another trace-based analysis 1028 of the traced program 124.

For example, a trace memory inspection tool may compute 1202 a derived property value 518, 702 and report 1018 with the derived value 702 an indication 704, 706 of likely accuracy or a pessimism measure 704, 706 for one or more values that were read 1204, in the sense that their derived values were used to compute the property's derived value.

As a specific example, in languages such as C# (a.k.a. "C-sharp"), some things that appear as 'fields' on classes are not, in fact, fields. They are called "properties". A property looks like a single value, but actually requires the execution of code in order to get that value. For example, consider the following class:

class StudentReport
{
  List<Student>_students;
  public double AverageGrade
  {
  double sum=0;
  foreach (Student s in _students)
  {
    sum+=s.Grade;
  }
  return sum/students.Count;
  }
}

A Visual Studio® tool user interface 210 (registered mark of Microsoft Corporation), or another debugging tool user interface, may offer various ways to visualize StudentReport.AverageGrade for any given StudentReport r. For example, a locals window might present something like this:

| variable | value | type |
|---|---|---|
| + r | StudentReport | StudentReport |
| \| – _students | List<Student> count = 30 | List<Student> |
| \| – AverageGrade | 72.6 | double |

Note that the user interface reports AverageGrade as though it were a regular field of StudentReport, even though code is executed to compute AverageGrade in order to display it. When debugging a live process, this computation 1202 of a property value can be done by an execution of the function body for StudentReport.Student because the debugger has intermediate language (IL) code for the body of StudentReport.Student, and the debugger has access to the current full process memory for the debuggee application.

However, in trace replay obtaining a property value is more difficult, and uncertainty in the values that are used to calculate a property value may cause uncertainty in the property value itself. When the user interface asks for the result of studentReport.AverageGrade, trace replay code 406 may try to execute the function body, but not all of the memory for all of the students will be available at the current execution time point. For example, maybe ten of the students' grades were read some time in the past during regular execution, but the remaining twenty were read in the future, relative to the execution time t for which the property value is sought. In this case, each time "sum+=s.Grade" is performed, the value of s.Grade is read from memory, and sometimes (given the heuristics herein and a particular implementation having "past value" and "future value" or the like as grounds), the memory read will report 1018 it as from the past, and sometimes it will report it as from the future. To give the user 104 a more accurate and useful report, a tracer may log (enter into the trace) each of those read times, and trace replay may report the most "pessimistic" value to the user, according to the ranking 828 example explained herein. So, in this case, since some of the student grades were read from the future, the user interface 210 might look something like this:

| variable | value | type |
|---|---|---|
| + r | StudentReport | StudentReport |
| \| – _students | List<Student> count = 30 | List<Student> |
| \| – AverageGrade | 72.6 [Next Known Value] | double |

If one of the student's grades is missing, the user interface could report:

| variable | value | type |
|---|---|---|
| + r | StudentReport | StudentReport |
| \| – _students | List<Student> count = 30 | List<Student> |
| \| – AverageGrade | [Unknown] | double |

Technical methods shown in the Figures or otherwise disclosed will be performed automatically, e.g., by a DAC adapter 408 or an adapted tool 122 having heuristic computation code 412, unless otherwise indicated. Methods may also be performed in part automatically and in part manually to the extent action by a human administrator or other human person is implicated, e.g., a person may prompt a tool user interface for a trace-based value, which causes the tool to invoke the heuristic computation code 412. But no method contemplated as innovative herein is entirely manual. In a given embodiment zero or more illustrated steps of a method may be repeated, perhaps with different parameters or data to operate on. Steps in an embodiment may also be done in a different order than shown in the Figures. Steps may be performed serially, in a partially overlapping manner, or fully in parallel. The order in which steps are performed during a given method may vary from one performance of the method to another performance of the method. Steps may also be omitted, combined, renamed, regrouped, or otherwise depart from the illustrated flows, provided that the method performed is operable and conforms to at least one claim.

Some embodiments use or provide a computer-implemented process for memory inspection. This process provides derived data values of memory cells from an execution trace. This memory inspection process includes receiving 1002 a query which specifies a plurality of memory cells and an execution time t; with a computer processor 110, executing 1006 a heuristic computation which searches 1010 at least a portion of the execution trace for state information of the memory cells; obtaining 1014 as results of the heuristic computation a respective derived value of each memory cell and a respective ground of that derived value, the obtained grounds including at least two of the following grounds 704: known-past-value, known-current-value, known-future-value; and reporting 1018 the derived values of the memory cells, together with at least one of the grounds, in a response to the query. The reporting includes providing information about the value of the memory cells which is not limited to any values that were recorded into the execution trace at execution time t. The derived values are based at least in part upon uncertainty as to the value of one or more of the memory cells at time t in view of the execution trace.

Some embodiments further include blending 1104 the obtained grounds into a blended ground 706. In these, the reporting includes reporting 1018 the derived values of the memory cells together with the blended ground.

In some embodiments, blending 1104 the obtained grounds includes selecting 1106 as the blended ground a most pessimistic ground. The selecting is based at least in part on a ranking 828 which ranks grounds as follows from most pessimistic to least pessimistic: no-value-found, known-future-value, known-past-value, known-current-value.

Figure 21:
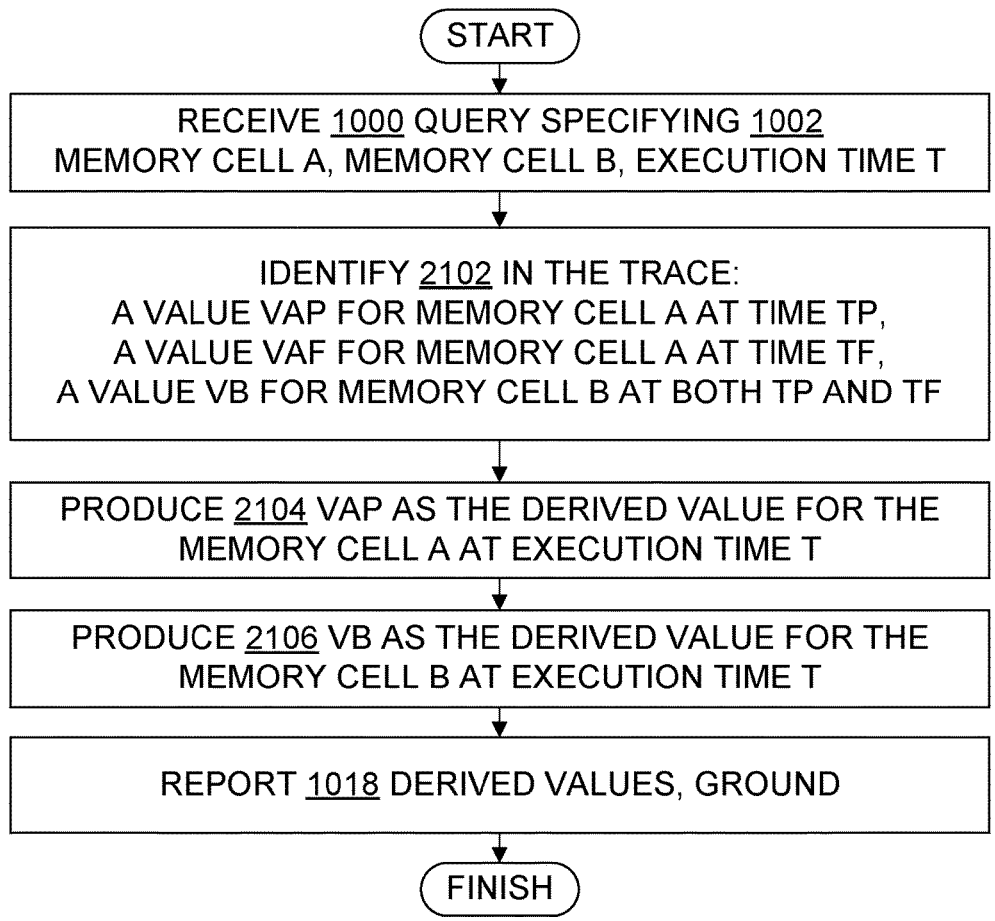
FIG. 21 is a flowchart illustrating a prefer-values-registered-together heuristic.

In some embodiments, and with reference now also to FIG. 21, the memory inspection process includes receiving 1002 a query which specifies a memory cell A and a memory cell B and an execution time t; identifying 2102 in the execution trace at least the following while executing the heuristic computation: a value vAp for memory cell A at an execution time point tp, a value vAf for memory cell A at an execution time point tf, and a value vB for memory cell B at or about the time tp and also at the time tf, where vAf is not equal to vAp, tp is prior to t, and tf is after t; and producing 2104 vAp as the derived value of the memory cell A, and producing 2106 vB as the derived value of the memory cell B, in a response to the query. Thus, if vB and vAp are recorded at the same time (e.g., in the past) then vAp is preferred over vAf. This process applies 1006 a prefer-values-registered-together heuristic 816. The production of vAp is also based at least upon uncertainty as to the value of the memory cell 502 at time t in view of the trace. In cases where the trace includes timecodes 424 that permit arithmetic with timecodes to identify execution points, tp may correspond to t−p, and tf may correspond to t+f, where p>0, f>0, and p and f are not necessarily equal.

This prefer-values-registered-together heuristic 816 recognizes that some pairs of memory cells (or more generally groups of N cells, N>1) tend to be updated at or near the same time, and therefore values taken from an update to all the memory cells 502 are favored over values taken from updates to only a proper subset of the cells. Some examples of cells that tend to be updated together include a variable that depends on another variable. Consider a per unit cost and a total cost, or a number of units and a total cost, where total cost is per unit cost times the number of units. All three will tend to be updated together. Another example is a property that is calculated based on a first cell storing a measurement and a second cell storing the unit of the first cell's measurement. As a more general example, a value that is calculated from one or more other values will tend to be updated when one or more of those other value are updated. One of skill will recognize that the heuristic 816 includes implementations in which values are updated in groups of three, or more, rather than as pairs. Also, the heuristic 816 includes implementations in which a delta 2408 can be used to determine that updates are sufficiently close in execution time, as opposed to being at the exact same execution time. Thus, "at or about the same time" can mean "within delta of the same execution time" in a given implementation. Delta's value may be set administratively, for example.

Some embodiments prefer values registered at the same time. So if a tool 122 asks for the values at memory location A and B and both exist at execution time point t−d1 and then A is changed at t+d2 but not B, these embodiments prefer the two values of t−d1 over that of t+d2. This heuristic may be employed in particular when the change in value is not a side effect of the traced code 124 but caused instead by an external force. A variation of this heuristic 816 does not require timecode arithmetic, and can be described thus: if a tool 122 asks for the values at memory location A and B at time t and both exist at execution time point td1 which is prior tot and then A is changed at execution time point td2 which is after t, but B is not changed at td2, then this embodiment prefers the two values found at time td1 over that found at time td2. This also illustrates that "registered together" means either updated together, or (when a delta is used) updated at or about the same execution time, or having known or heuristically-derived respective values of a minimum certainty at the same execution time.

One of skill will appreciate that other methods are also within the scope of the teachings presented here. In particular, other methods may perform multiple heuristics, and other methods may perform different heuristic(s) than the particular examples recited above. Methods using any of the heuristics 800 are within the present disclosure, including for example the heuristics shown in any one or more of FIGS. 13-24, regardless of whether they are among the examples above. Any claim consistent with the following form may be understood to be among the claims taught herein: A memory inspection method including receiving a query seeking a memory cell value at a specified execution time point and with a processor executing a heuristic computation code 412 which is configured to perform <heuristics>where the material in brackets is replaced by one or more heuristic names of the heuristics 802-826, or by a description of one or more of the heuristics 802-826.

Configured Media

Some embodiments include a configured computer-readable storage medium 112. Medium 112 may include disks (magnetic, optical, or otherwise), RAM, EEPROMS or other ROMs, and/or other configurable memory, including in particular computer-readable media (which are not mere propagated signals or mere energy). The storage medium which is configured may be in particular a removable storage medium 114 such as a CD, DVD, or flash memory. A general-purpose memory, which may be removable or not, and may be volatile or not, can be configured into an embodiment using items such as a DAC adapter 408, heuristic computation code 412, machine-level queries 414 and responses 416, rankings 828, derived values 702 and grounds 704, 706, and map 830, in the form of data 118 and instructions 116, read from a removable medium 114 and/or another source such as a network connection, to form a configured medium. The configured medium 112 is capable of causing a computer system to perform technical process steps for level-crossing (high-level in tool 122 to low-level in trace 418) trace-based memory inspection as disclosed herein. The Figures thus help illustrate configured storage media embodiments and process embodiments, as well as system and process embodiments. In particular, any of the process steps illustrated in FIG. 4, or 10-25, or otherwise taught herein, may be used to help configure a storage medium to form a configured medium embodiment.

Some embodiments use or provide a computer readable storage medium 112, 114 configured with code which upon execution by a computer processor 110 performs a trace-based memory inspection process. The process includes receiving 1002 a query which specifies a memory cell and an execution time t; with the computer processor, determining 1036 that an execution trace fails to expressly specify a known value for the memory cell at the time t; with the computer processor, executing 1006 a heuristic computation which searches 1010 at least a portion of the execution trace for state information of the memory cell; obtaining 1014 as results of the heuristic computation a derived value of the memory cell and a ground of that derived value; and reporting 1018 the derived value of the memory cell, together with the ground, in a response to the query. The reporting provides information about the value of the memory cell which is not limited to any values that were recorded into the execution trace at execution time t, because no value was expressly specified for the cell at time tin the trace.

Figure 18:
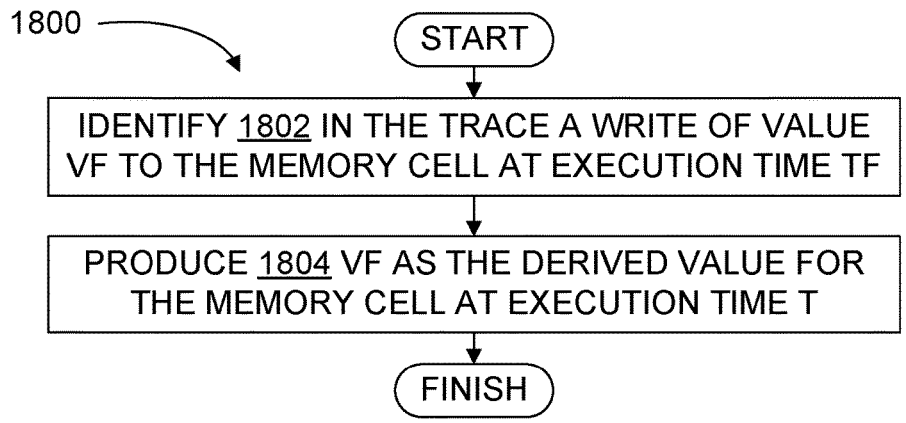
FIG. 18 is a flowchart illustrating a use-future-write heuristic.

In some embodiments, and with reference now also to FIG. 18, executing 1006 the heuristic computation includes identifying 1802 in the trace a write operation which wrote a value vf to the memory cell at execution time point tf which is after execution time t, and producing 1804 vf in the heuristic computation results as the derived value of the memory cell, thereby applying 1006 a use-future-write heuristic 818. The production of vf also is based at least upon uncertainty as to the value of the memory cell at time tin view of the trace. In cases where the trace includes timecodes 424 that permit arithmetic with timecodes to identify execution points, tf may correspond to t+f, where f>0.

Some embodiments treat a future write to a value as a read of that written value at the execution time point of the write. Some trace generators (a.k.a. recorders) perform a read before performing a write. This is not necessarily required, but can be very useful for debugging. In traces 418 recorded by such trace generators, if the read is not recorded in the trace then the value likely hasn't changed from the last time it was seen.

In some embodiments, and with reference now also to FIG. 12, the query specifies a memory cell which is allocated to hold a property value 518, and the property value is defined by a calculation 1202 which is configured to read 1204 at least one other memory cell to obtain a value x for use in calculating 1202 the property value, and the process includes executing 1006 at least one heuristic computation to obtain 1014 a derived value for x.

Figure 25:
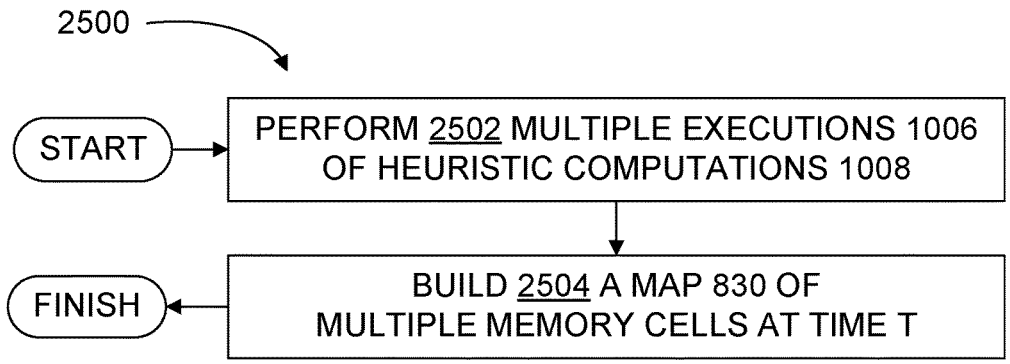
FIG. 25 is a flowchart illustrating a process for building a mapping between an execution time t and memory cell derived values at time t.

In some embodiments, and with reference now also to FIG. 25, the process includes performing 2502 multiple executions of one or more heuristic computations which search at least a portion of the execution trace for state information, and building 2504 a map 830 between execution time t and multiple memory cells. The map uses one or more of the following: one or more values 708 recorded at time tin the execution trace (known-current-values, a.k.a. express indications of value at time sought), or one or more derived values 702 which were produced by the one or more heuristic computations 1008.

Figure 22:
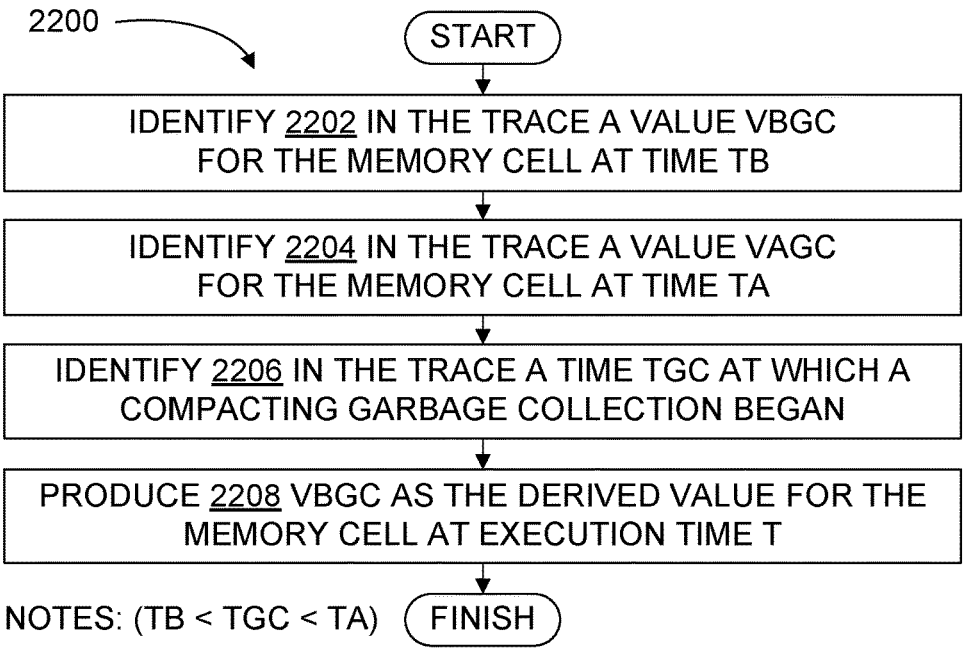
FIG. 22 is a flowchart illustrating a before-garbage-collection heuristic.

In some embodiments, and with reference now also to FIG. 22, executing 1006 the heuristic computation includes identifying 2202 in the trace a value vbgc for the memory cell at an execution time point tb, identifying 2204 in the trace a value vagc for the memory cell at a, execution time point ta, identifying 2206 in the trace an execution time point tgc at which a compacting garbage collection operation began, where tb<tgc, tgc<ta (or "tb is before tgc, tgc is before ta"), and producing 2208 vbgc in the heuristic computation results as the derived value of the memory cell. This embodiment applies 1006 a before-garbage-collection heuristic 820. The production of vbgc is based at least upon uncertainty as to the value of the memory cell at time tin view of the trace.

Figure 23:
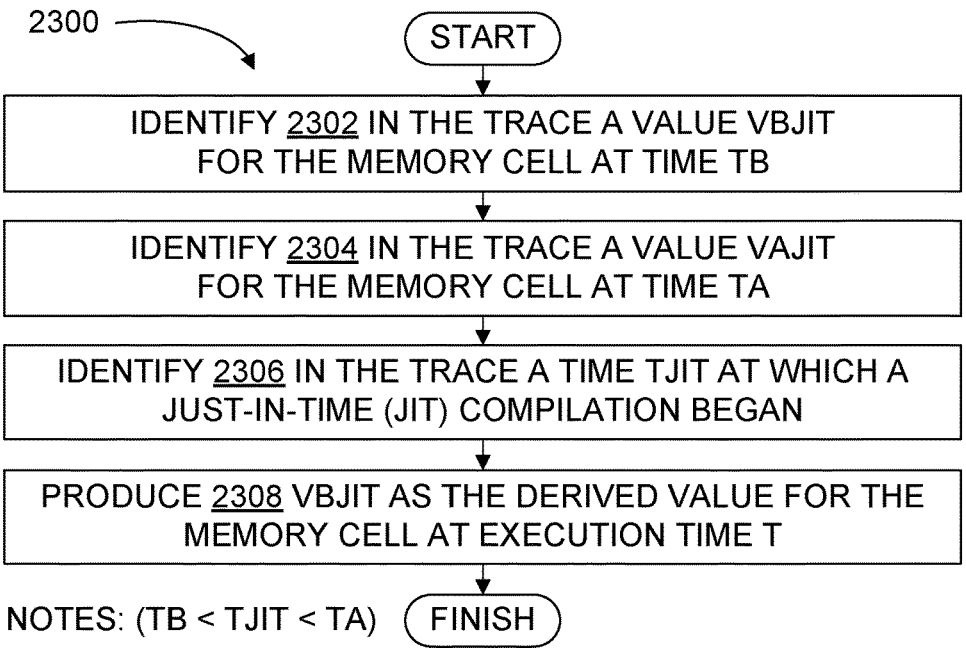
FIG. 23 is a flowchart illustrating a before-jit-compilation heuristic.

In some embodiments, and with reference now also to FIG. 23, executing 1006 the heuristic computation includes identifying 2302 in the trace a value vbjit for the memory cell at an execution time point tb, identifying 2304 in the trace a value vajit for the memory cell at an execution time ta, identifying 2306 in the trace an execution time point tjit at which a just-in-time or dynamic compilation operation began, where tb<tjit, tjit<ta (or "tb is before tjit, tjit is before ta"), and producing 2308 vbjit in the heuristic computation results as the derived value of the memory cell. This embodiment applies 1006 a before-jit-compilation heuristic 822. The production of vbjit is based at least upon uncertainty as to the value of the memory cell at time tin view of the trace.

Figure 24:
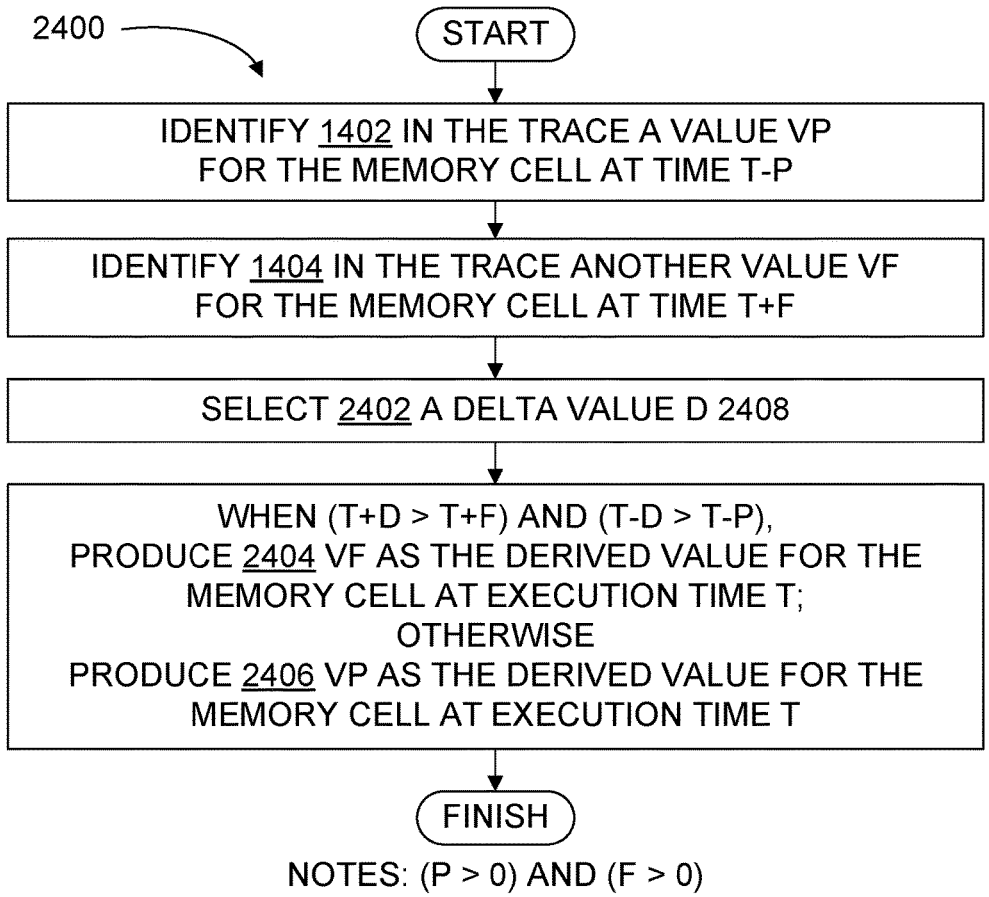
FIG. 24 is a flowchart illustrating a prefer-close-future-else-past heuristic.

In some embodiments, and with reference now also to FIG. 24, executing 1006 the heuristic computation includes identifying 1402 in the trace a value vp for the memory cell at an execution time point t−p, with p>0, identifying 1404 in the trace a value vf for the memory cell at an execution time point t+f, with f>0, selecting 2402 a delta value d 2408 when (t+d>t+f) and (t−d>t−p) then producing 2404 vf in the heuristic computation results as the derived value of the memory cell, and otherwise producing 2406 vp as the derived value of the memory cell. This embodiment applies 1006 a prefer-close-future-else-past heuristic 824. This can be understood as "always report the last known value unless the next known value is significantly closer". The delta d 2408 can be chosen in multiple ways, such as based on experimental evidence, or as a multiple or fraction of t−p. When delta==zero, the past is preferred, and when delta==f+1, the closest in execution time value will be preferred, and if f==p then the past closest in execution time value will be preferred. The production of of or vp is also based at least upon uncertainty as to the value of the memory cell at time tin view of the trace.

The foregoing description of an example of the prefer-close-future-else-past heuristic 824 applies in embodiments where timecode arithmetic is available, e.g., closeness in execution time is determined by counting clock ticks or counting the number of instructions between two timecodes. However, one of skill can apply the heuristic 824 in other cases, using other measurements of execution time point closeness.

In some embodiments, executing 1006 the heuristic computation includes applying 1006 at least one of the heuristics 802-826. Some include applying 1006 at least two of the heuristics 802-826. Some include applying 1006 at least three of the heuristics 802-826. Some include applying 1006 at least four of the heuristics 802-826. Some include applying 1006 at least five of the heuristics 802-826. Some include applying 1006 at least six of the heuristics 802-826. Some include applying 1006 at least N of a (possibly proper) subset of M of the heuristics 802-826, with N ranging from 1 to M, and M ranging from two to thirteen, to define different embodiments, which may be system, apparatus, configured medium (statutory media only), or method embodiments.

One of skill will appreciate that other configured medium embodiments are also within the scope of the teachings presented here. In particular, other embodiments may include statutory media configured with code to upon execution perform multiple heuristics, and different heuristic(s) than the particular examples recited above. Media configured to perform methods using any of the heuristics 800 are within the present disclosure, including for example the heuristics shown in any one or more of FIGS. 13-24, regardless of whether they are among the examples above. Any claim consistent with the following form may be understood to be among the claims taught herein: A computer-readable storage medium configured with code which upon execution by a processor performs a memory inspection method, the method including receiving a query seeking a memory cell value at a specified execution time point and with a processor executing a heuristic computation code 412 which is configured to perform <heuristics> where the material in brackets is replaced by one or more heuristic names of the heuristics 802-826, or by a description of one or more of the heuristics 802-826.

Some Additional Combinations and Variations

Any of these combinations of code, data structures, logic, components, communications, and/or their functional equivalents may also be combined with any of the systems and their variations described above. A process may include any steps described herein in any subset or combination or sequence which is operable. Each variant may occur alone, or in combination with any one or more of the other variants. Each variant may occur with any of the processes and each process may be combined with any one or more of the other processes. Each process or combination of processes, including variants, may be combined with any of the medium combinations and variants describe above.

Some embodiments parse a trace file and use a trace memory inspection tool to build a mapping 830 between execution time t and multiple memory and register contents recorded at t or produced by the tool via heuristic computation, or both.

Some embodiments use different heuristics for code vs. global data vs. stack data. Some make a distinction between different kinds of global data, e.g., process heap vs. global heap. Some make a distinction based on interpretation of the value, e.g., pointers vs. monotonic counters vs. hardware registers vs. bifflags vs. other interpretations. In some situations, a memory cell value changes, but only one bit is of interest. In this case, a comparison to detect if the "value"

changed may only consider the values stored in the specific bit(s) of interest in those memory cell(s). In some embodiments, a trace memory inspection tool 122 applies 1006 one predefined heuristic 800 when the memory cell 502 contains a code instruction and the tool applies a different predefined heuristic when the memory cell contains non-executable data. In some, a memory inspection tool 122 applies 1006 a one heuristic 800 when the memory cell 502 contains global data and the tool applies a different predefined heuristic when the memory cell contains stack data.

Some embodiments report 1018 whether the returned value 702 was found in the past (relative to the sought execution time t) instead of being a current or other value. Some report 1018 similarly that a future value is being returned instead of current or past value.

Other heuristics 800 may also be applied in various situations. For instance, a no-outstanding-kernel-call heuristic 826 may be applied after a search of the trace confirms there is no outstanding kernel call at requested execution time t, similar to the before-garbage-collection 820 and before-jit-compilation 822 heuristics. Heuristics 826 apply if the available information indicates that memory is not shared across processes, or indicates which parts of memory are the buffer regions that the kernel may alter (e.g., on a ReadFile call), to give two more of the possible examples. In general, if an embodiment can estimate the odds of an external entity to the current thread touching the memory, then those odds can be part of a heuristic 800; one example is the external-access-likelihood heuristic 810.

As another example assume the value of memory location X at execution time t is sought. Before t, at time p there is a read on X with value A; after t, at time n there is a read on X with value B. Consider two scenarios, denoted here as scenario R and scenario S.

In scenario R, the execution of kernel calls might not be fully traced, between t and p there are no kernel calls pending, none of the kernel calls that could have async implications have X in their buffers, and all process threads are recorded. But between t and n there are several kernel calls with X in their buffer. Irrespective of whether p is closer or not than n to t, it may be preferable to produce the value A for X (over the value B). One reason is that the activities which are likely to have changed the value of X take place after t, not before t.

In scenario S, the execution of kernel calls might not be fully traced, between t and p there are several kernel calls that have X in their buffers, while between t and n there are no such calls. All threads are recorded after t but not before t. In this case, it may be preferable to produce the value B for X (over the value A), since the changes to X are likely to have already taken place at time t.

Some embodiments consider the partial information in heuristics, or rely on other heuristics, or both. For example, assume between p and n (with a current execution time point tin between) there were no kernel calls nor pending async work that (per API contract) would have touched the address X. Between t and p there were two non-recorded threads, and between t and n there were a hundred non-recorded threads. In this case, the heuristic 824 implementation may reflect that it is more likely the value of X changed after t (more unrecorded threads) than before t. So in this scenario instead of checking whether $(t-p)<(n-t)$ to determine whether to take A or take B, one embodiment adjusts the probability of the value being modified at each execution time span $(p \ldots t)$ and $(t \ldots n)$ accordingly (e.g., linearly, logarithmically, etc.). As a simple example, a linear probability might be $(p \ldots t)==2/(100+2)$, while $(t \ldots n)==100/(100+2)$ (where 2 and 100 are the unrecorded thread counts).

In some embodiments, a debugger data access component (DAC) adapter 408 allows the DAC 208 to communicate through the adapter with a trace file replay component 406 to get for the DAC the value of a specified memory cell at a specified execution time point in the trace. The adapter 408 receives an execution time t and a memory cell identifier, and returns a candidate value or a known value held by the memory cell at time t. The memory cell identifier 602 can be a RAM address, or a register name.

In some embodiments, a trace replay component translates between a trace file 420 location 424 and a location in source code 212, using source-IL mapping and IL-machine mapping.

In some embodiments, a portion of runtime functionality is provided in the trace replay component 406. But instead of the runtime mediating between the debugger, user code, and the operating system as it does in a live process per FIG. 2, this runtime functionality mediates between the debugger and the trace file(s) 420.

Some trace recording processes only record two things. One is the execution of code instructions, which are executed potentially on multiple threads in parallel. The other is snapshots of specific blocks of memory taken at discrete points in execution time, e.g., to capture a portion of the stack when selective recording is initiated. From the execution of code instructions, one can only infer the values of memory locations that the program actively accesses while being recorded. From the snapshots, one gets only a sparse (in time and/or space) view of the values of memory locations that were explicitly recorded. Therefore, when a debugger 200 queries to obtain memory values from the trace at some execution time t, there is sometimes ambiguity to be resolved. In some cases, there is no ambiguity, e.g., multiple values for the memory location are found in the trace but they all match. But in other cases, there is ambiguity and a choice is made, as taught herein, by applying one or more heuristics.

As further examples of heuristic value derivation, and in particular examples of choosing between heuristics, using a selection 1106 between heuristics or a ranking 828 of heuristics to produce a derived value 702 may depend on the interpretation of the memory cell 502, e.g., whether it is a pointer, a monotonically changing value, a hardware register, and so on. Suppose one heuristic says the value is 0x8000a338, and another heuristic says that the value is 0x8004a338, and the value is known to be a pointer to memory, or likely to be a pointer, so providing a derived value that does not precisely match one of these two values does not assist 1024 the analysis that is underway. However, if the value is a loop counter, the real-time clock, or another value that has a known method of switching between two values, then an estimate may be valuable to the user 104. Also, if the value was known to be 0x00001000 at execution time t==300, and known to be 0x00004000 at t==600, and the value is known to increment monotonically in 0x100 increments, and the request is for the value at t==450, it might be reasonable to interpolate the value as an estimated value 702 equal to 0x00002800.

CONCLUSION

Although particular embodiments are expressly illustrated and described herein as processes, as configured media, or as systems, it will be appreciated that discussion of one type of embodiment also generally extends to other embodiment types. For instance, the descriptions of processes in connection with FIGS. 10-25 also help describe configured media, and help describe the technical effects and operation of systems and manufactures like those discussed in connection with other Figures. It does not follow that limitations from one embodiment are necessarily read into another. In particular, processes are not necessarily limited to the data structures and arrangements presented while discussing systems or manufactures such as configured memories.

Those of skill will understand that implementation details may pertain to specific code, such as specific APIs, specific fields, and specific sample programs, and thus do not necessarily appear in every embodiment. Those of skill will also understand that program identifiers and some other terminology used in discussing details are implementation-specific and thus do not necessarily pertain to every embodiment. Nonetheless, although they are not necessarily required to be present here, such details may help some readers by providing context and/or may illustrate a few of the many possible implementations of the technology discussed herein.

Reference herein to an embodiment having some feature X and reference elsewhere herein to an embodiment having some feature Y does not exclude from this disclosure embodiments which have both feature X and feature Y, unless such exclusion is expressly stated herein. All possible negative claim limitations are within the scope of this disclosure, in the sense that any feature which is stated to be part of an embodiment may also be expressly removed from inclusion in another embodiment, even if that specific exclusion is not given in any example herein. The term "embodiment" is merely used herein as a more convenient form of "process, system, article of manufacture, configured computer readable medium, and/or other example of the teachings herein as applied in a manner consistent with applicable law." Accordingly, a given "embodiment" may include any combination of features disclosed herein, provided the embodiment is consistent with at least one claim.

Not every item shown in the Figures is necessarily present in every embodiment. Conversely, an embodiment may contain item(s) not shown expressly in the Figures. Although some possibilities are illustrated here in text and drawings by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways in a given implementation without necessarily omitting desired technical effects from the collection of interacting modules viewed as a whole.

Reference has been made to the figures throughout by reference numerals. Any apparent inconsistencies in the phrasing associated with a given reference numeral, in the figures or in the text, should be understood as simply broadening the scope of what is referenced by that numeral. Different instances of a given reference numeral may refer to different embodiments, even though the same reference numeral is used. Similarly, a given reference numeral may be used to refer to a verb, a noun, and/or to corresponding instances of each, e.g., a processor 110 may process 110 instructions by executing them.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims and the abstract, as filed, are part of the specification.

While exemplary embodiments have been shown in the drawings and described above, it will be apparent to those of ordinary skill in the art that numerous modifications can be made without departing from the principles and concepts set forth in the claims, and that such modifications would not necessarily encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

All changes which fall short of enveloping an entire abstract idea but come within the meaning and range of equivalency of the claims are to be embraced within their scope to the full extent permitted by law.

What is claimed is:

1. A memory inspection system which provides derived data values from an execution trace, in response to queries from a high-level tool having a data access component (DAC), the memory inspection system comprising:
   at least one processor;
   a digital memory in operable communication with the processor; and
   a DAC adapter which includes a heuristic computation code and an interface, the DAC adapter being configured to, upon execution by the processor, perform a process that includes the following:
   (a) receive in the interface a query which specifies a memory cell and an execution time t,
   (b) determine automatically that the execution trace fails to expressly specify a known value for the memory cell at the time t,
   (c) with the processor, execute the heuristic computation code, whereby the heuristic computation code produces a derived value for the memory cell at the time t based on information in the execution trace, and
   (d) provide in the interface a response to the query, the response including the derived value together with an indication that the value provided in the response for the memory cell at the time t is derived, inclusion of the derived value based at least upon uncertainty as to the value of the memory cell at time t in view of the execution trace.

2. The memory inspection system of claim 1, wherein the heuristic computation code comprises a single-bracketing-value heuristic computation code which is configured to upon execution:
   identify in the execution trace a value v for the memory cell at an execution time tp,
   identify in the execution trace the same value v for the memory cell at an execution time tf, and produce v as the derived value for the memory cell at the time t.

3. The memory inspection system of claim 1, wherein the heuristic computation code comprises a prefer-closer-in-time heuristic computation code which is configured to upon execution perform at least one of the following:
- identify in the execution trace a value vm for the memory cell at an execution time t−m, identify in the execution trace a value vn for the memory cell at an execution time t−n, where m>n>0, and produce vn as the derived value for the memory cell at the time t; or
- identify in the execution trace a value vm for the memory cell at an execution time t+m, identify in the execution trace a value vn for the memory cell at an execution time t+n, where m>n>0, and produce vn as the derived value for the memory cell at the time t.

4. The memory inspection system of claim 1, wherein the heuristic computation code comprises a prefer-past heuristic computation code which is configured to upon execution:
- identify in the execution trace a value vp for the memory cell at an execution time tp,
- identify in the execution trace a value of for the memory cell at an execution time tf, and
- produce vp as the derived value for the memory cell at the time t.

5. The memory inspection system of claim 1, wherein the heuristic computation code comprises a stack-memory heuristic computation code which is configured to upon execution:
- identify in the execution trace a value v for the memory cell at an execution time tp,
- determine stack memory activity between tp and an execution time t, including determining that the memory cell was part of allocated stack memory at tp and determining whether stack shrinkage excluded the memory cell from allocated stack memory between tp and t, and
- produce v as the derived value for the memory cell at the time t together with a ground indicating the stack memory activity determined.

6. The memory inspection system of claim 1, wherein the heuristic computation code comprises an external-access-likelihood heuristic computation code which is configured to upon execution:
- identify in the execution trace a value vp for a memory cell at an execution time tp of a thread,
- obtain an access likelihood estimate based on a characteristic of the memory cell and indicating a likelihood that the memory cell was written by a code external to the thread, and
- produce vp as the derived value for the memory cell at the time t and with vp produce a ground indicating the characteristic of the memory cell and use of that characteristic in producing vp.

7. The memory inspection system of claim 1, wherein the heuristic computation code comprises a prefer-no-gap heuristic computation code which is configured to upon execution:
- identify in the execution trace a value vj for the memory cell at an execution time tj, with tj prior to t,
- identify in the execution trace a value vk for the memory cell at an execution time tk, with tk prior to t,
- determine that there is a tracing gap in the trace such that tracing did not occur for at least part of an interval between the times tj and t,
- determine that there is no tracing gap in the trace between the times tk and t, and
- produce vk as the derived value for the memory cell at the time t.

8. The memory inspection system of claim 1, wherein the heuristic computation code comprises a prefer-current-thread heuristic computation code which is configured to upon execution:
- identify in the execution trace a value vc for the memory cell at an execution time tc on a thread tcurr which was executing at time t,
- identify in the execution trace a value vd for the memory cell at a different execution time td on a thread tdiff which is a different thread than tcurr, and
- produce vc as the derived value for the memory cell at the time t based at least in part on tcurr being the thread which was executing at time t.

9. A computer-implemented memory inspection process which provides derived data values of memory cells from an execution trace, the memory inspection process comprising:
- receiving a query which specifies a plurality of memory cells and an execution time t;
- with a computer processor, executing a heuristic computation which searches at least a portion of the execution trace for state information of the memory cells;
- obtaining as results of the heuristic computation a respective derived value of each memory cell and a respective ground of that derived value, the obtained grounds comprising at least two of the following grounds: known-past-value, known-current-value, known-future-value; and
- reporting the derived values of the memory cells, together with at least one of the grounds, in a response to the query;
- wherein the reporting comprises providing information about the value of the memory cells which is not limited to any values that were recorded into the execution trace at time t, and the derived values are based at least in part upon uncertainty as to the value of one or more of the memory cells at time t in view of the execution trace.

10. The memory inspection process of claim 9, further comprising blending the obtained grounds into a blended ground, and wherein the reporting comprises reporting the derived values of the memory cells together with the blended ground.

11. The memory inspection process of claim 10, wherein blending the obtained grounds comprises selecting as the blended ground a most pessimistic ground, and wherein the selecting is based at least in part on a ranking which ranks grounds as follows from most pessimistic to least pessimistic: no-value-found, known-future-value, known-past-value, known-current-value.

12. The memory inspection process of claim 9, wherein the process comprises:
- receiving a query which specifies a memory cell A and a memory cell B and an execution time t;
- identifying in the trace at least the following while executing the heuristic computation: a value vAp for memory cell A at an execution time t−p, a value vAf for memory cell A at an execution time t+f, and a value vB for memory cell B at the time t−p and also at the time t+f, where p>0, f>0, and vAf is not equal to vAp; and
- producing vAp as the derived value of the memory cell A, and producing vB as the derived value of the memory cell B, in a response to the query,
- thereby applying a heuristic which is denoted here a prefer-values-registered-together heuristic.

13. A computer readable storage medium configured with code which upon execution by a computer processor performs a trace-based memory inspection process, the process comprising:

receiving a query which specifies a memory cell and an execution time t;

with the computer processor, determining that an execution trace fails to expressly specify a known value for the memory cell at the time t;

with the computer processor, executing a heuristic computation which searches at least a portion of the execution trace for state information of the memory cell;

obtaining as results of the heuristic computation a derived value of the memory cell and a ground of that derived value; and reporting the derived value of the memory cell, together with the ground, in a response to the query;

wherein the reporting comprises providing information about the value of the memory cell which is not limited to any values that were recorded into the execution trace at time t, and the derived values are based at least in part upon uncertainty as to the value of one or more of the memory cells at time t in view of the execution trace.

14. The computer readable storage medium of claim 13, wherein executing the heuristic computation comprises:

identifying in the trace a write operation which wrote a value vf to the memory cell at an execution time tf, with tf after an execution time t, and producing vf in the heuristic computation results as the derived value of the memory cell at the execution time t, thereby applying a heuristic which is denoted here a use-future-write heuristic.

15. The computer readable storage medium of claim 13, wherein the query specifies a memory cell which is allocated to hold a property value, and the property value is defined by a calculation which is configured to read at least one other memory cell to obtain a value x for use in calculating the property value, and wherein the process comprises executing at least one heuristic computation to obtain a derived value for x.

16. The computer readable storage medium of claim 13, wherein the process comprises:

performing multiple executions of one or more heuristic computations which search at least a portion of the execution trace for state information; and building a map between execution time t and multiple memory cells using one or more of the following: one or more values recorded at time t in the execution trace, one or more derived values produced by the one or more heuristic computations.

17. The computer readable storage medium of claim 13, wherein executing the heuristic computation comprises:

identifying in the trace a value vbgc for the memory cell at an execution time tb, identifying in the trace a value vagc for the memory cell at an execution time ta, identifying in the trace a time tgc at which a compacting garbage collection operation began, where tb is prior to tgc and tgc is prior to ta, and producing vbgc in the heuristic computation results as the derived value of the memory cell and based at least on a capacity of the garbage collection operation to alter the value of the memory cell, thereby applying a heuristic which is denoted here a before-garbage-collection heuristic.

18. The computer readable storage medium of claim 13, wherein executing the heuristic computation comprises:

identifying in the trace a value vbjit for the memory cell at an execution time tb, identifying in the trace a value vajit for the memory cell at an execution time ta, identifying in the trace a time tjit at which a just-in-time or dynamic compilation operation began, where tb is prior to tjit and tjit is prior to ta, and producing vbjit in the heuristic computation results as the derived value of the memory cell and based at least on a capacity of the just-in-time or dynamic compilation operation to alter the value of the memory cell, thereby applying a heuristic which is denoted here a before-jit-compilation heuristic.

19. The computer readable storage medium of claim 13, wherein executing the heuristic computation comprises:

identifying in the trace a value vp for the memory cell at an execution time t−p, with p>0, identifying in the trace a value vf for the memory cell at an execution time t+f, with f>0, selecting a delta value d, when (t+d>t+f) and (t−d>t−p) then producing vf in the heuristic computation results as the derived value of the memory cell, and otherwise producing vp as the derived value of the memory cell, thereby applying a heuristic which is denoted here a prefer-close-future-else-past heuristic.

20. The computer readable storage medium of claim 13, wherein executing the heuristic computation comprises applying at least one of the following heuristics:

a single-bracketing-value heuristic;
a prefer-closer-in-time heuristic;
a prefer-past heuristic;
a stack-memory heuristic;
an access-likelihood heuristic;
a prefer-no-gap heuristic;
a prefer-current-thread heuristic;
a prefer-values-registered-together heuristic;
a use-future-write heuristic;
a before-garbage-collection heuristic;
a before-jit-compilation heuristic; or
a prefer-close-future-else-past heuristic.

* * * * *